United States Patent
Lin et al.

(10) Patent No.: US 12,302,633 B2
(45) Date of Patent: May 13, 2025

(54) SEMICONDUCTOR DEVICES AND METHODS OF MANUFACTURING THEREOF

(71) Applicant: Taiwan Semiconductor Manufacturing Company Limited, Hsinchu (TW)

(72) Inventors: Shih-Yao Lin, New Taipei (TW); Chih-Han Lin, Hsinchu (TW); Ming-Ching Chang, Hsinchu (TW); Shu-Yuan Ku, Zhubei (TW); Tzu-Chung Wang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/679,004

(22) Filed: May 30, 2024

(65) Prior Publication Data
US 2024/0321891 A1 Sep. 26, 2024

Related U.S. Application Data

(63) Continuation of application No. 18/344,571, filed on Jun. 29, 2023, now Pat. No. 12,021,084, which is a
(Continued)

(51) Int. Cl.
*H10D 84/85* (2025.01)
*H10D 30/01* (2025.01)
(Continued)

(52) U.S. Cl.
CPC ....... *H10D 84/853* (2025.01); *H10D 30/0243* (2025.01); *H10D 30/6211* (2025.01);
(Continued)

(58) Field of Classification Search
CPC ............... H10D 84/853; H10D 62/115; H10D 30/6211; H10D 84/0158; H10D 30/0243; H10D 84/038; H10D 84/0151
See application file for complete search history.

(56) References Cited

U.S. PATENT DOCUMENTS 11,721,700 B2    8/2023  Lin et al.
2020/0357896 A1* 11/2020 Cheng ................ H01L 27/0886
(Continued)

OTHER PUBLICATIONS

Final Office Action on U.S. Appl. No. 17/355,395 DTD Dec. 28, 2022.
(Continued)

*Primary Examiner* — Christine A Enad
(74) *Attorney, Agent, or Firm* — FOLEY & LARDNER LLP

(57) ABSTRACT

A semiconductor device includes a substrate. The semiconductor device includes a dielectric fin that is formed over the substrate and extends along a first direction. The semiconductor device includes a gate isolation structure vertically disposed above the dielectric fin. The semiconductor device includes a gate structure extending along a second direction perpendicular to the first direction. The gate structure includes a first portion and a second portion separated by the gate isolation structure and the dielectric fin. The first portion of the gate structure presents a first beak profile and
(Continued)

the second portion of the gate structure presents a second beak profile. The first and second beak profiles point toward each other.

20 Claims, 22 Drawing Sheets

Related U.S. Application Data continuation of application No. 17/355,395, filed on Jun. 23, 2021, now Pat. No. 11,721,700.

(51) Int. Cl.
*H10D 30/62* (2025.01)
*H10D 62/10* (2025.01)
*H10D 84/01* (2025.01)
*H10D 84/03* (2025.01)

(52) U.S. Cl.
CPC ....... *H10D 62/115* (2025.01); *H10D 84/0151* (2025.01); *H10D 84/0158* (2025.01); *H10D 84/038* (2025.01)

(56) References Cited

U.S. PATENT DOCUMENTS

| | | | |
|---|---|---|---|
| 2021/0126109 A1* | 4/2021 | Lin | ................ H01L 21/823431 |
| 2021/0242093 A1 | 8/2021 | Lin et al. | |
| 2021/0327763 A1* | 10/2021 | Lin | ................ H01L 21/823418 |
| 2021/0351039 A1 | 11/2021 | Huang et al. | |
| 2021/0367059 A1 | 11/2021 | Lin et al. | |
| 2022/0415888 A1* | 12/2022 | Hsieh | ................ H01L 21/28123 |

OTHER PUBLICATIONS

Non-Final Office Action on U.S. Appl. No. 17/355,395 DTD Aug. 17, 2022.
Non-Final Office Action on U.S. Appl. No. 18/344,571 DTD Feb. 12, 2024.
Notice of Allowance on U.S. Appl. No. 17/355,395 DTD Mar. 20, 2023.
Notice of Allowance on U.S. Appl. No. 18/344,571 DTD Feb. 29, 2024.

* cited by examiner

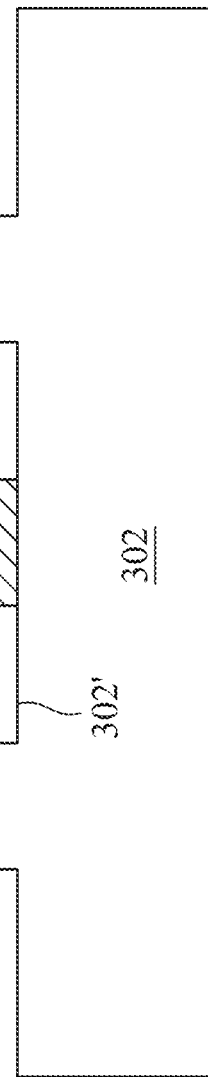
FIG. 6

SEMICONDUCTOR DEVICES AND METHODS OF MANUFACTURING THEREOF

CROSS-REFERENCE TO RELATED APPLICATIONS

This application is a continuation of U.S. patent application Ser. No. 18/344,571, filed on Jun. 29, 2023, which is a continuation of U.S. patent application Ser. No. 17/355,395, now U.S. Pat. No. 11,721,700, filed on Jun. 23, 2021, the entire contents of both of which are incorporated herein by reference for all purposes.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12, 13, 14, 15A, 15B, 15C, 16A, 16B, 16C, 17, and 18 illustrate cross-sectional views of an example FinFET device (or a portion of the example FinFET device) during various fabrication stages, made by the method of FIG. 2, in accordance with some embodiments.

DETAILED DESCRIPTION

Figure 1:
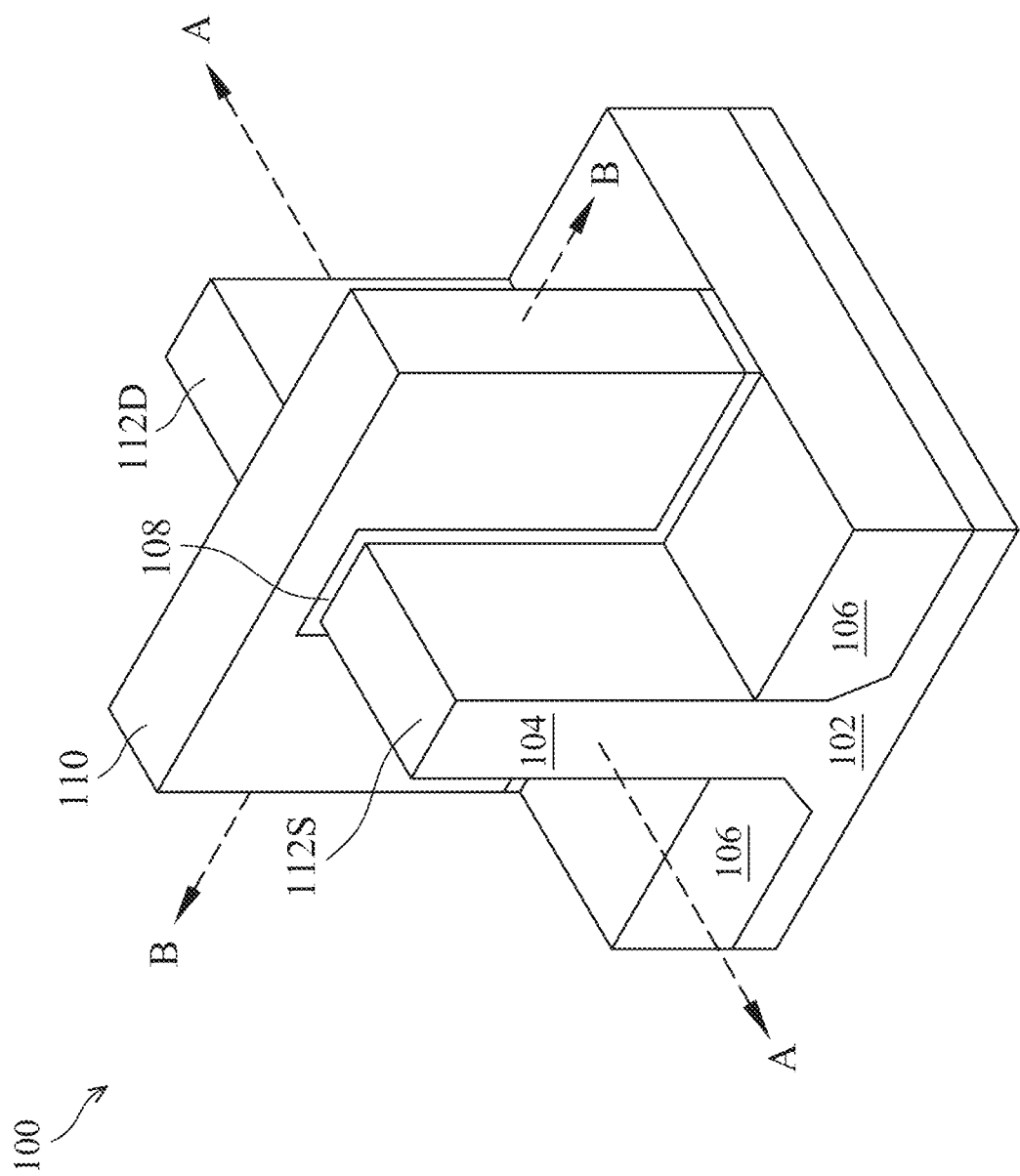
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In some embodiments, a dummy gate structure, which includes a dummy gate dielectric and a dummy gate, is formed over a number of fins. The fins can include one or more active fins and one or more dummy fins. Hereinafter, the term "active fin" is referred to as a fin that will be adopted as an active channel to electrically conduct current in a finished semiconductor device (e.g., FinFET device 300 shown below), when appropriately configured and powered; and the term "dummy fin" is referred to as a fin that will not be adopted as an active channel (i.e., a dummy channel) to electrically conduct current in a finished semiconductor device (e.g., FinFET device 300 shown below). Next, gate spacers are formed around the dummy gate structure. After an interlayer dielectric (ILD) layer is formed around the gate spacers to overlay respective source/drain regions for each of the active fins, a portion of the dummy gate over at least one of the dummy fins between two adjacent ones of the active fins is removed. In addition to removing the portion of the dummy gate, a portion of the dummy gate dielectric can be removed. Next, the removed portions of the dummy gate and the dummy gate dielectric are replaced with a gate isolation structure. Next, the remaining portion of the dummy gate structure is replaced with an active gate structure, which can include one or more metal gate layers.

Metal gate layers over multiple fins formed by the above described method can reduce gate leakage in advanced processing nodes. For example, the gate isolation structure is formed over the dummy fin to disconnect, intercept, cut, or otherwise separate the metal gate layers. Forming the gate isolation structure to cut metal gate layers can allow different portions of the metal gate layers to be electrically coupled to respective active fin(s). In other words, the different portions of the metal gate layers are desired to be electrically isolated from each other.

However, a gate isolation structure formed by the existing technologies, may not completely separate the different portions of the metal gate layers, which can induce a short circuit established therebetween. For example, the existing technologies typically stop the removal process of the dummy gate structure upon exposing the dummy gate dielectric. Due to processing variation (e.g., where some dummy fins are overlaid by a thicker dummy gate dielectric and some other dummy fins are overlaid by a thinner dummy gate dielectric), a portion of the dummy gate dielectric, which should have been removed, may still remain on some of the dummy fins after the removal process. Such a remaining portion of the dummy gate dielectric may sometimes be referred to as residual dummy gate dielectric. During the replacement of the active gate structure, such a residual dummy gate dielectric may also be replaced with a conductive material (e.g., a metal gate layer of the active gate structure), which results in shorting different portions of the metal gate layer that should be electrically isolated from each other. As such, undesired gate leakage may be induced.

By further removing a portion of the dummy gate dielectric subsequently to removing a portion of the dummy gate, even though the above-mentioned processing variation occurs, it can be assured that no portion of the dummy gate dielectric remains on the dummy fin. A gate isolation structure can be formed over the dummy fin. As such, after replacing the dummy gate structure with an active gate structure, a metal gate layer of the active gate structure can include two portions, separated by the gate isolation structure, that are electrically isolated from each other. In this way, the undesired gate leakage can be avoided. In accordance with various embodiments, the separated portions of the active gate structure can each present a beak (e.g., a bird's beak) profile, which will be discussed in further detail below.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
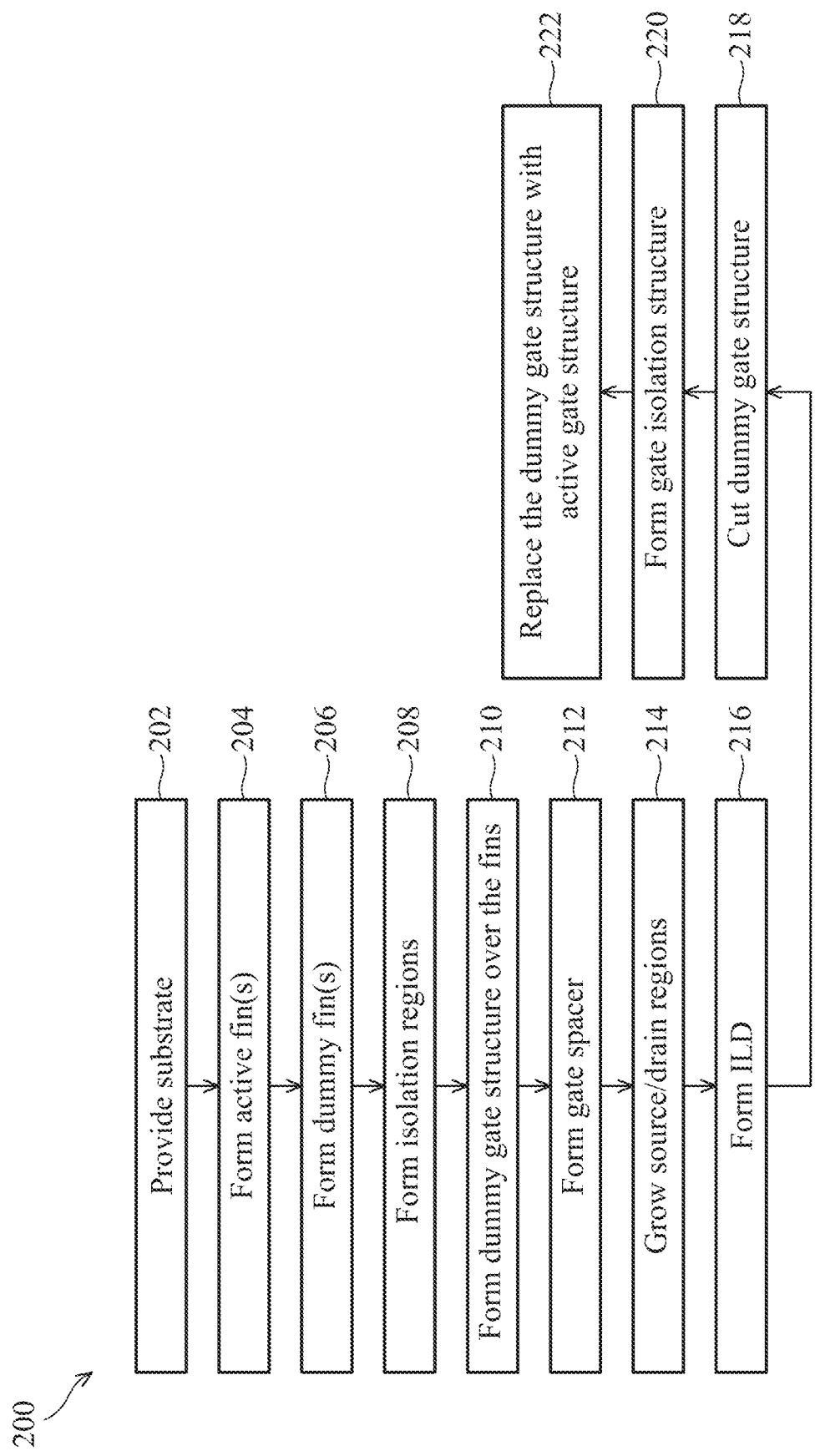
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15A, 15B, 15C, 16A, 16B, 16C, 17, and 18, respectively, which will be discussed in further detail below.

In brief overview, the method 200 starts with operation 202 of providing a substrate. The method 200 continues to operation 204 of forming one or more active fins. The method 200 continues to operation 206 of forming one or more dummy fins. The method 200 continues to operation 208 of forming isolation regions. The method 200 continues to operation 210 of forming a dummy gate structure over the fins. The dummy gate structures can include a dummy gate dielectric and a dummy gate disposed above the dummy gate dielectric. The method 200 continues to operation 212 of forming a gate spacer. The gate spacers are extended along sidewalls of the dummy gate structure. The method 200 continues to operation 214 of growing source/drain regions. The method 200 continues to operation 216 of forming an interlayer dielectric (ILD). The method 200 continues to operation 218 of cutting the dummy gate structure, which removes a portion of the dummy gate dielectric disposed above at least one of the dummy fins. The method 200 continues to operation 220 of forming a gate isolation structure. The method 200 continues to operation 222 of replacing the dummy gate structure with an active gate structure.

Figure 12:
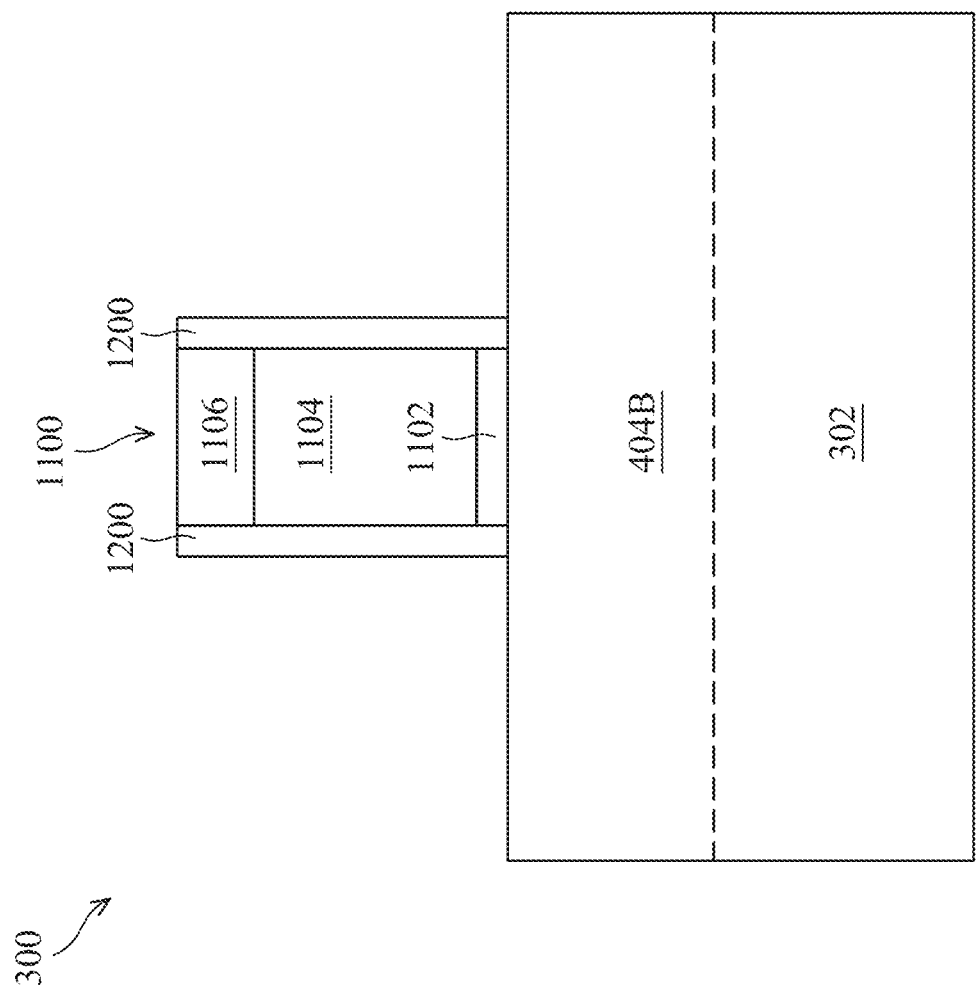
Figure 13:
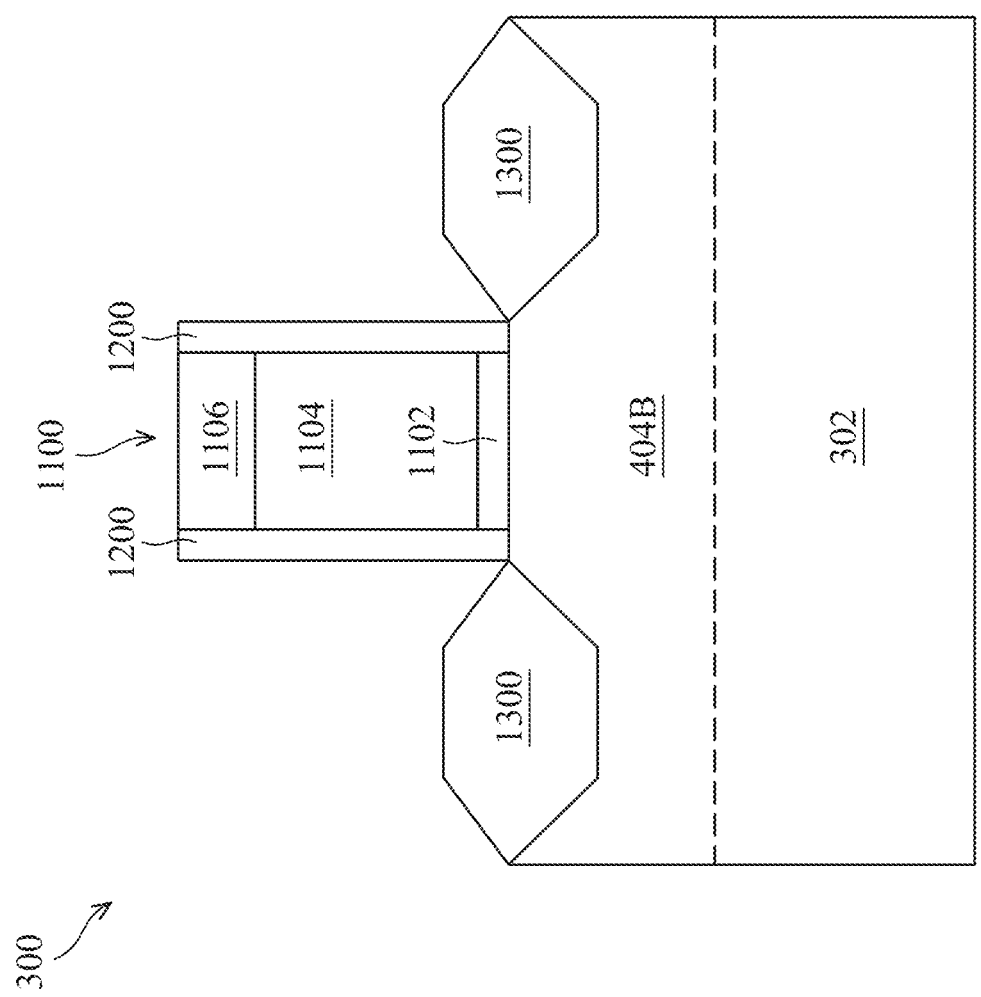
Figure 14:
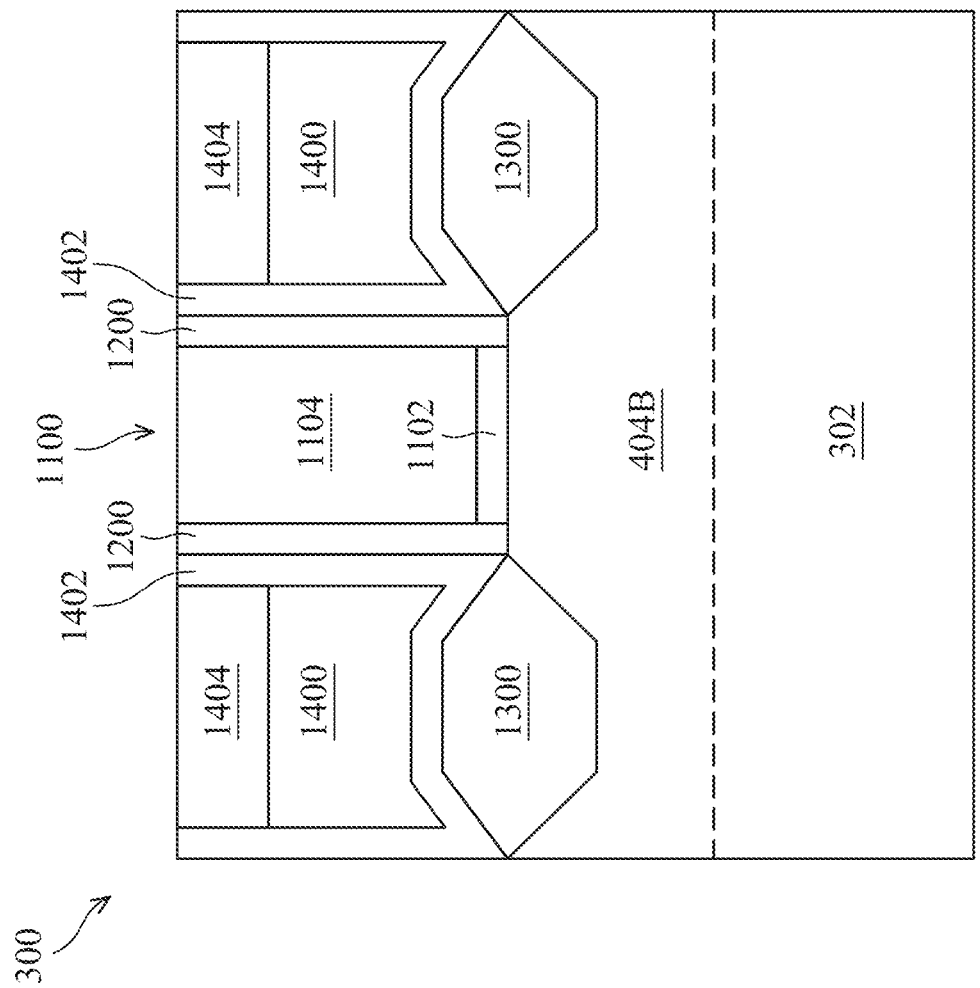

As mentioned above, FIGS. 3-18 each illustrate, in a cross-sectional view, a portion of a FinFET device 300 at various fabrication stages of the method 200 of FIG. 2. The FinFET device 300 is similar to the FinFET device 100 shown in FIG. 1, but with multiple fins. For example, FIGS. 3-11 and 15A-18 illustrate cross-sectional views of the FinFET device 300 along cross-section B-B (as indicated in FIG. 1); and FIGS. 12-14 illustrate cross-sectional views of the FinFET device 300 along cross-section A-A (as indicated in FIG. 1). Although FIGS. 3-18 illustrate the FinFET device 300, it is understood the FinFET device 300 may include a number of other devices such as inductors, fuses, capacitors, coils, etc., which are not shown in FIGS. 3-18, for purposes of clarity of illustration.

Figure 3:
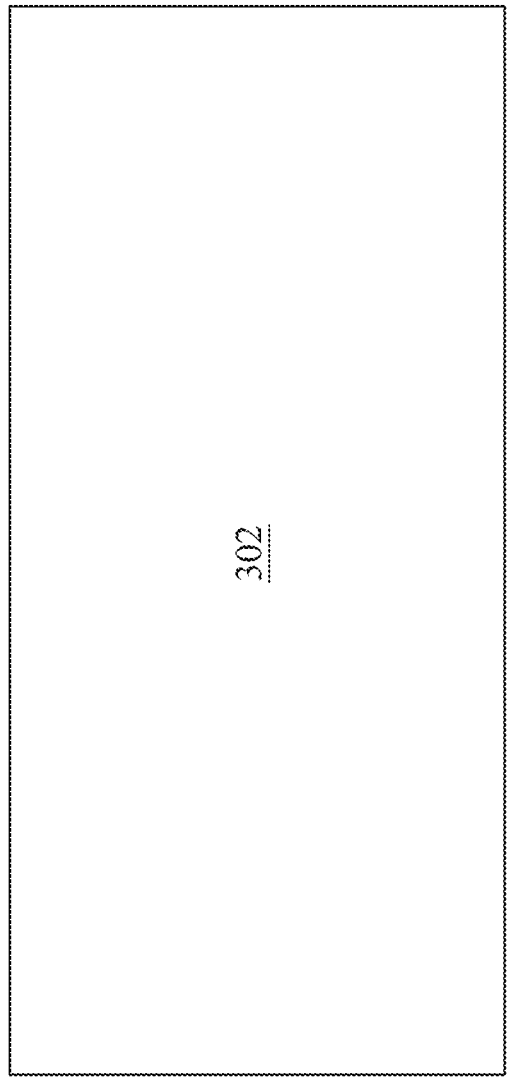

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
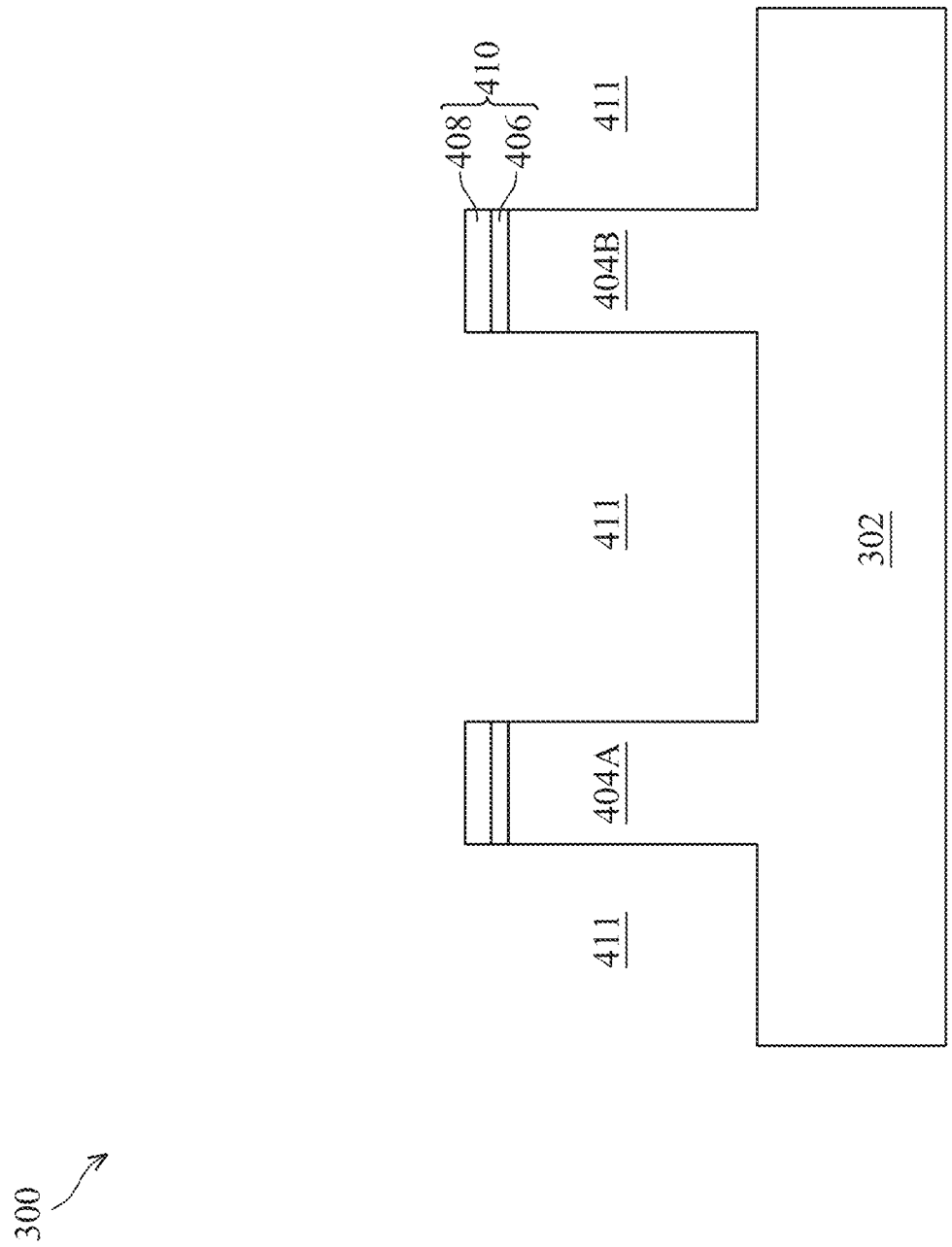

Corresponding to operation 204 of FIG. 2, FIG. 4 is a cross-sectional view of the FinFET device 300 including semiconductor fins 404A and 404B at one of the various stages of fabrication. The cross-sectional view of FIG. 4 is cut along the lengthwise direction of an active/dummy gate structure of the FinFET device 300 (e.g., cross-section B-B indicated in FIG. 1).

The semiconductor fins 404A-B may be each configured as an active fin, which will be adopted as an active (e.g., electrically functional) fin or channel in a respective completed FinFET. Hereinafter, the semiconductor fins 404A-B may sometimes be referred to as "active fins 404A-B." Although two semiconductor fins are shown in the illustrated example, it should be appreciated that the FinFET device 300 can include any number of semiconductor fins while remaining within the scope of the present disclosure.

The semiconductor fins 404A-B are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the active fins 404A-B between adjacent trenches 411 as illustrated in FIG. 4. When multiple fins are formed, such a trench may be disposed between any adjacent ones of the fins. In some embodiments, the active fins 404A-B are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 404A-B.

The active fins 404A-B may be patterned by any suitable method. For example, the active fins 404A-B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the active fins 404A-B, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 404A-B that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 404A-B may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
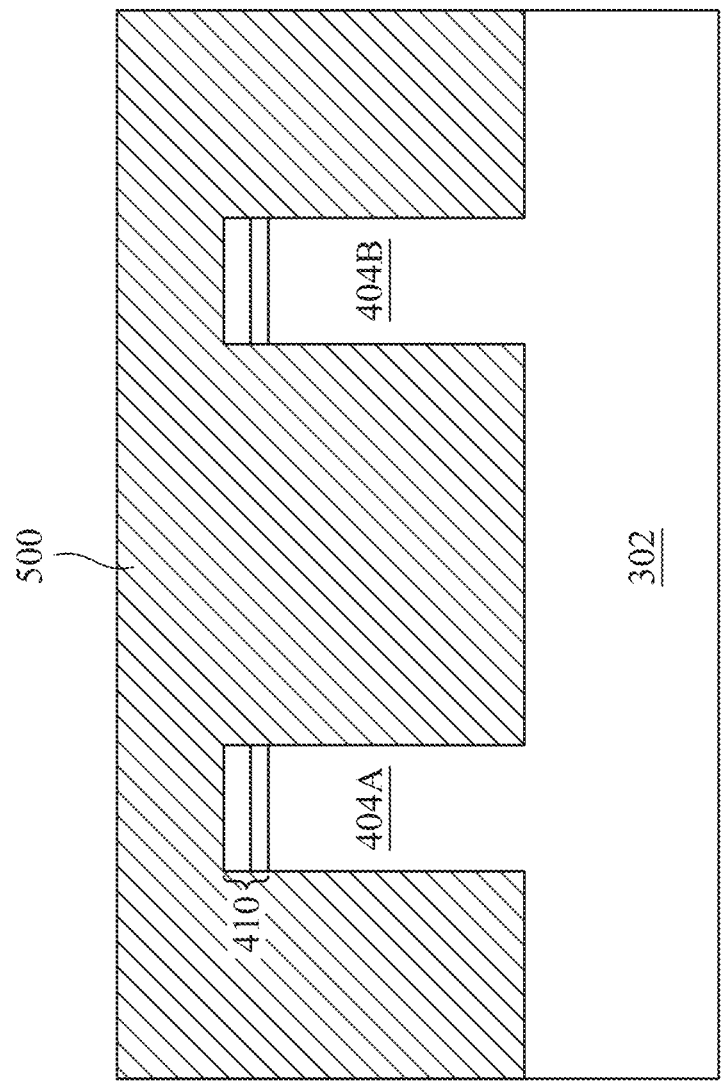
Figure 7:
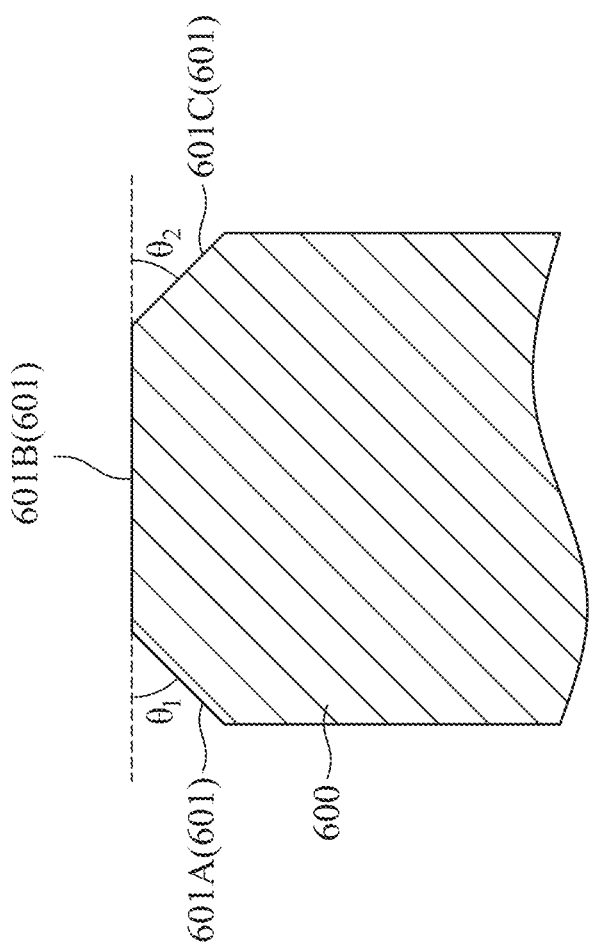

Corresponding to operation 206 of FIG. 2, FIG. 5 is a cross-sectional view of the FinFET device 300 including a dummy channel layer 500 at one of the various stages of fabrication, and FIG. 6 is a cross-sectional views of the FinFET device 300 including a dummy fin 600 at one of the various stages of fabrication. FIG. 7 is an enlarged view of the cross-sectional view of the dummy fin 600. The cross-sectional views of FIGS. 5-7 are each cut along the lengthwise direction of an active/dummy gate structure of the FinFET device 300 (e.g., cross-section B-B indicated in FIG. 1).

Referring first to FIG. 5, the dummy channel layer 500 can include a dielectric material used to form one or more dummy fins. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer 500 may be formed using low-pressure chemical vapor deposition (LPCVD) or plasma enhanced chemical vapor deposition (PECVD), for example.

Upon depositing the dummy channel layer 500 overlaying the active fins 404A-B, one or more dummy fins, e.g., 600, may be formed between the active fins 404A-B. For example in FIG. 6, the dummy fin 600 is formed between the active fins 404A and 404B. The dummy fin 600 can be formed by patterning the dummy channel layer 500 using, for example, photolithography and etching techniques. For example, a patterned mask may be formed over the dummy channel layer 500 to mask portions of the dummy channel layer 500 to form the dummy fin 600. Subsequently, unmasked portions of the dummy channel layer 500 may be etched using, for example, reactive ion etch (RIE), neutral beam etch (NBE), the like, or combinations thereof, thereby defining the dummy fin 600 between adjacent active fins 404A-B (or in the trench 411). The etch may be anisotropic, in some embodiments. In some other embodiments, the dummy fin 600 may be formed concurrently with or subsequently to forming isolation regions (e.g., 700 of FIG. 7) between adjacent active fins, which will be discussed below.

In advanced processing nodes, such a dummy fin can be disposed next to one or more active fins (e.g., between two adjacent active fins) to improve the overall design and fabrication of a semiconductor device. For example, dummy fins can be used for optical proximity correction (OPC) to enhance a pattern density and pattern uniformity in the stage of designing the semiconductor device. In another example, adding dummy fins adjacent to active fins can improve chemical-mechanical polishing (CMP) performance when fabricating the semiconductor device. The dummy fin is designed to stay inactive or electrically non-functional, when the semiconductor device is appropriately configured and powered.

In accordance with various embodiments, the dummy fin 600 may be formed as having a top surface 601 that includes one or more facets 601A, 601B, and 601C, as illustrated in the enlarged view of FIG. 7. Although three facets are shown, it should be understood that the surface 601 can include any number of facets while remaining within the scope of the present disclosure. Such facets can collectively form a continuous curve (e.g., a $C^0$ curve, a $C^1$ curve, a $C^\infty$ curve, etc.), when viewed in the cross-section, in some other embodiments. In the illustrated example of FIG. 7 (and the following figures), the facet 601B may be substantially horizontal (e.g., in parallel with a top surface of the substrate 302) and the facets 601A and 601C connected to two ends of the facet 601B may be tilted toward the substrate 302 with respective angles, $\theta_1$ and $\theta_2$. The angles $\theta_1$ and $\theta_2$ can be similar to or different from each other. For example, the angles $\theta_1$ and $\theta_2$ can each range from about 15° to about 88°. In some embodiments, the angles $\theta_1$ and $\theta_2$ may be proportional to a height of the tilted facets 601A/601C that is projected on a vertical axis or surface, $H_1$, as shown in FIG. 7. For example, the greater the projected height $H_1$, the greater the angles $\theta_1$ and $\theta_2$.

Figure 8:
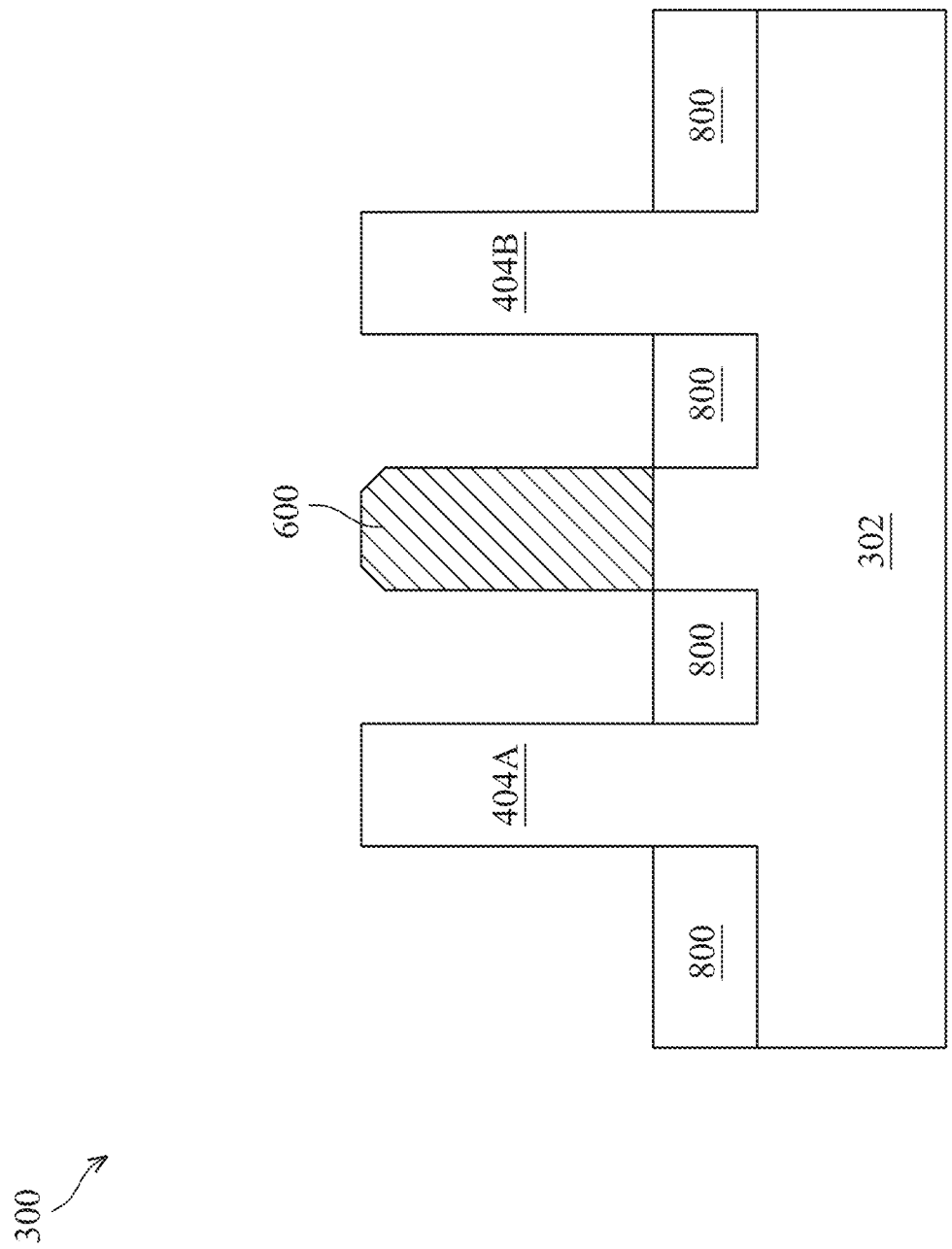

Corresponding to operation 208 of FIG. 2, FIG. 8 is a cross-sectional view of the FinFET device 300 including isolation regions 800 at one of the various stages of fabrication. The cross-sectional view of FIG. 8 is cut along the lengthwise direction of an active/dummy gate structure of the FinFET device 300 (e.g., cross-section B-B indicated in FIG. 1).

The isolation regions 800, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 800 and a top surface of the fins 404A-B and 600 that are coplanar (not shown). The patterned mask 410 may be removed by the planarization process, in some embodiments.

In some embodiments, the isolation regions 800 include a liner, e.g., a liner oxide (not shown), at the interface between each of the isolation regions 800 and the substrate 302 (active fins 404A-B). In some embodiments, the liner oxide is formed to reduce crystalline defects at the interface between the substrate 302 and the isolation region 800. Similarly, the liner oxide may also be used to reduce crystalline defects at the interface between the active fins 404A-B and the isolation region 800. The liner oxide (e.g., silicon oxide) may be a thermal oxide formed through a thermal oxidation of a surface layer of the substrate 302, although other suitable method may also be used to form the liner oxide.

Next, the isolation regions 800 are recessed to form shallow trench isolation (STI) regions 800, as shown in FIG. 8. The isolation regions 800 are recessed such that the upper portions of the fins 404A-B and 600 protrude from between neighboring STI regions 800. Respective top surfaces of the STI regions 800 may have a flat surface (as illustrated), a convex surface, a concave surface (such as dishing), or combinations thereof. The top surfaces of the STI regions 800 may be formed flat, convex, and/or concave by an appropriate etch. The isolation regions 800 may be recessed using an acceptable etching process, such as one that is selective to the material of the isolation regions 800. For example, a dry etch or a wet etch using dilute hydrofluoric (DHF) acid may be performed to recess the isolation regions 800.

Figure 9:
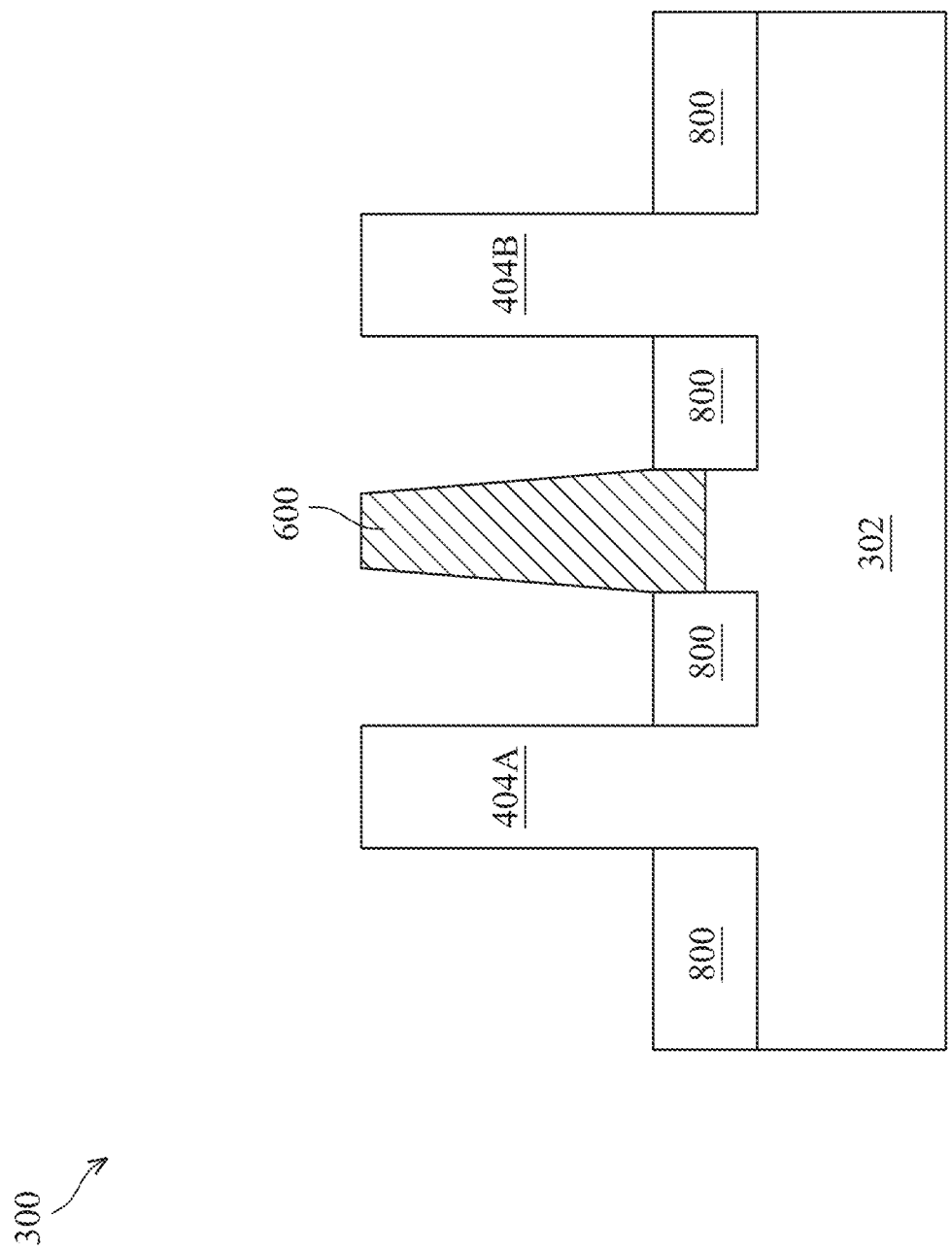

In some other embodiments, the dummy fin 600 may be formed concurrently with or subsequently to the formation of the isolation regions 800 to cause various profiles of the dummy fin 600 (with respect to the isolation regions 800) to be formed, which will be respectively discussed below with reference to FIGS. 9 and 10.

For example, when forming the active fins 404A-B (FIG. 4), one or more other active fins may also be formed in the trench 411. The insulation material of the isolation regions 800 may be deposited over the active fins, followed by a CMP process to planarize the top surfaces of the isolation regions 800 and the active fins, which include the active fins 404A-B and the active fins formed in the trench 411. Subsequently, an upper portion of the active fins formed in the trench 411 may be partially removed to form cavities. The cavities are then filled with the dielectric material of the dummy channel layer 500, followed by another CMP process to form the dummy fin 600. The isolation regions 800 are recessed to form the shallow trench isolation (STI) regions 800, as shown in FIG. 9. Using such a method to form the dummy fin 600, the dummy fin 600 can be formed on the substrate 302 and a bottom surface of the dummy fin 600 is below the top surface of the isolation regions 800, as shown in FIG. 9. Depending on how much of the isolation regions 800 is recessed, the bottom surface of the dummy fin 600 may be above the top surface of the isolation regions 800, while remaining within the scope of the present disclosure.

In another example, after forming the active fins 404A-B (FIG. 4), the insulation material of the isolation regions 800 may be deposited over the active fins 404A-B in a controlled deposition rate, thereby causing cavities to be spontaneously formed in the trench 411. The cavities are then filled with the dielectric material of the dummy channel layer 500, followed by a CMP process to form the dummy fin 600. The isolation regions 800 are recessed to form the shallow trench isolation (STI) regions 800, as shown in FIG. 10. Using such a method to form the dummy fin 600, the dummy fin 600 can be formed on the isolation regions 800 and a bottom surface of the dummy fin 600 is embedded in the corresponding isolation region 800, as shown in FIG. 10.

In yet another example, after forming the active fins 404A-B (FIG. 4) and depositing the insulation material of the isolation regions 800 over the active fins 404A-B, a patterned mask may be formed over the isolation regions 800 to expose portions of the isolation regions 800 to form the dummy fin 600 (e.g., in the trench 411). Subsequently, the exposed portions of the isolation regions 800 may be etched using, for example, reactive ion etch (RIE), neutral beam etch (NBE), the like, or combinations thereof, thereby defining cavities. The cavities are then filled with the dielectric material of the dummy channel layer 500, followed by a CMP process to form the dummy fin 600, which is similar to the illustrated embodiment of FIG. 10.

Figure 10:
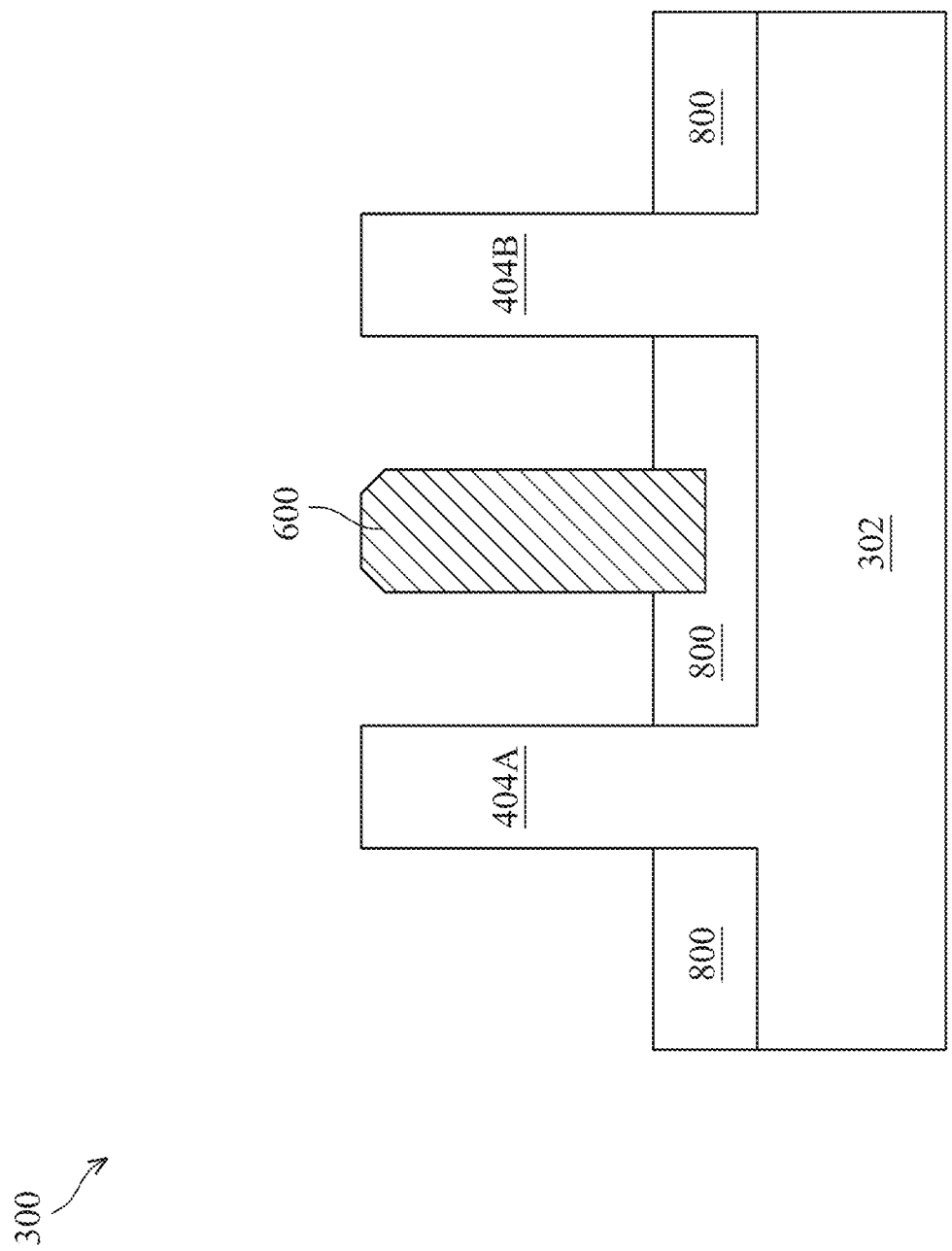
Figure 11:
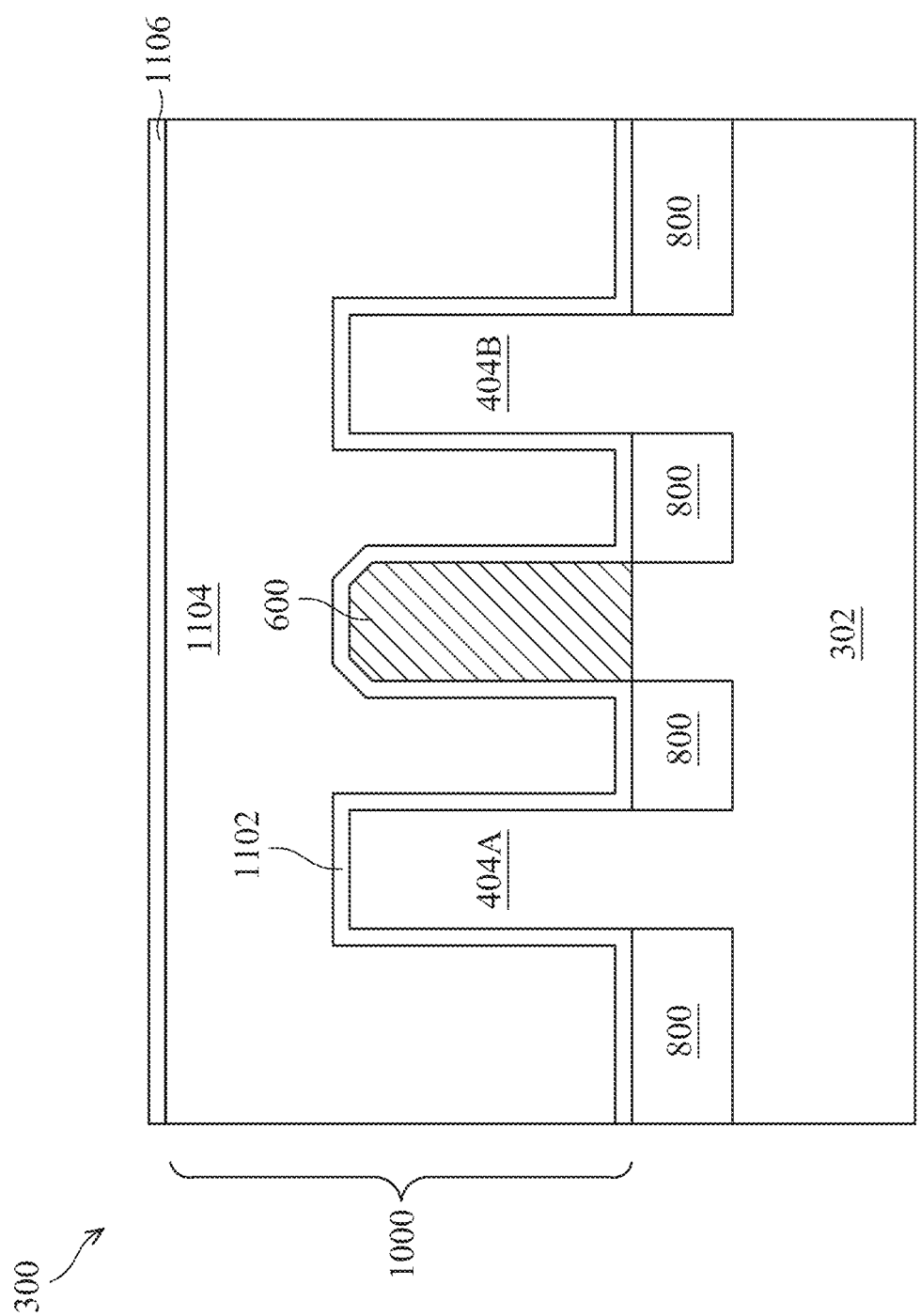

Corresponding to operation 210 of FIG. 2, FIG. 11 is a cross-sectional view of the FinFET device 300 including a dummy gate structure 1100 at one of the various stages of fabrication. The cross-sectional view of FIG. 11 is cut along the lengthwise direction of the dummy gate structure 1100 (e.g., cross-section B-B indicated in FIG. 1). In the example of FIG. 10 (and the following figures), the dummy gate structure 1100 is formed to overlay a respective portion of each of the fins (e.g., active fins 404A-B, dummy fin 600) that are illustrated in FIG. 8. It should be understood that the dummy gate structure 1100 can also be formed over the fins that are illustrated in FIGS. 9-10, while remaining within the scope of the present disclosure.

The dummy gate structure 1100 includes a dummy gate dielectric 1102 and a dummy gate 1104, in some embodiments. A mask 1006 may be formed over the dummy gate structure 1100. To form the dummy gate structure 1100, a dielectric layer is formed on the active fins 404A-B and dummy fin 600. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 1106. The pattern of the mask 1106 then may be transferred to the gate layer and the dielectric layer by a suitable etching technique to form the dummy gate 1104 and the underlying dummy gate dielectric 1102, respectively. The dummy gate 1104 and the dummy gate dielectric 1102 straddle or otherwise cover a respective portion (e.g., a channel region) of each of the active fins 404A-B and the dummy fin 600. For example, when one dummy gate structure is formed, a dummy gate and dummy gate dielectric of the dummy gate structure may straddle respective central portions of the fins. The dummy gate 1104 may also have a lengthwise direction (e.g., direction B-B of FIG. 1) perpendicular to the lengthwise direction (e.g., direction of A-A of FIG. 1) of the fins.

The dummy gate dielectric 1102 is shown to be formed over the active fins 404A-B and the dummy fin 600 (e.g., over the respective top surfaces and the sidewalls of the fins) and over the STI regions 800 in the example of FIG. 10. In other embodiments, the dummy gate dielectric 1102 may be formed by, e.g., thermal oxidation of a material of the fins, and therefore, may be formed over the fins but not over the STI regions 800. It should be appreciated that these and other variations are still included within the scope of the present disclosure.

FIGS. 12-14 illustrate the cross-sectional views of further processing (or making) of the FinFET device 300 along the lengthwise direction (e.g., cross-section A-A indicated in FIG. 1) of one of the active fins 404A-B. As a representative example, one dummy gate structure (e.g., 1100) is illustrated over the active fin 404B in FIGS. 12-14. It should be appreciated that more or less than one dummy gate structure can be formed over the fin 404B (and each of the other fins, e.g., 404A, 600), while remaining within the scope of the present disclosure.

Corresponding to operation 212 of FIG. 2, FIG. 12 is a cross-sectional view of the FinFET device 300 including a gate spacer 1200 formed around (e.g., along and contacting the sidewalls of) the dummy gate structure 1100. The cross-sectional view of FIG. 12 is cut along the lengthwise direction of the active fin 404B (e.g., cross-section A-A indicated in FIG. 1).

For example, the gate spacer 1200 may be formed on opposing sidewalls of the dummy gate structure 1100. Although the gate spacer 1200 is shown as a single layer in the example of FIG. 12 (and the following figures), it should be understood that the gate spacer can be formed to have any number of layers while remaining within the scope of the present disclosure. The gate spacer 1200 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1200. The shapes and formation methods of the gate spacer 1200 as illustrated in FIG. 12 are merely non-limiting examples, and other shapes and formation methods are possible. These and other variations are fully intended to be included within the scope of the present disclosure.

Corresponding to operation 214 of FIG. 2, FIG. 13 is a cross-sectional view of the FinFET device 300 including a number (e.g., 2) of source/drain regions 1300 at one of the various stages of fabrication. The cross-sectional view of FIG. 13 is cut along the lengthwise direction of the active fin 404B (e.g., cross-section A-A indicated in FIG. 1).

The source/drain regions 1300 are formed in recesses of the active fin 404B adjacent to the dummy gate structures 1100, e.g., between adjacent dummy gate structures 1100 and/or next to a dummy gate structure 1100. The recesses are formed by, e.g., an anisotropic etching process using the dummy gate structures 1100 as an etching mask, in some embodiments, although any other suitable etching process may also be used.

The source/drain regions 1300 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 13, the epitaxial source/drain regions 1300 may have surfaces raised from the top surface of the active fin 404B (e.g., raised above the non-recessed portions of the active fin 404B) and may have facets. In some embodiments, the source/drain regions 1300 of the adjacent fins may merge to form a continuous epitaxial source/drain region (not shown). In some embodiments, the source/drain regions 1300 of the adjacent fins may not merge together and remain separate source/drain regions 1300 (not shown). In some embodiments, when the resulting FinFET device is an n-type FinFET, the source/drain regions 1300 can include silicon carbide (SiC), silicon phosphorous (SiP), phosphorous-doped silicon carbon (SiCP), or the like. In some embodiments, when the resulting FinFET device is a p-type FinFET, the source/drain regions 1300 comprise SiGe, and a p-type impurity such as boron or indium.

The epitaxial source/drain regions 1300 may be implanted with dopants to form source/drain regions 1300 followed by an annealing process. The implanting process may include forming and patterning masks such as a photoresist to cover the regions of the FinFET device 300 that are to be protected from the implanting process. The source/drain regions 1300 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain regions 1300 of a P-type transistor. N-type impurities, such as phosphorous or arsenide, may be implanted in the source/drain regions 1300 of an N-type transistor. In some embodiments, the epitaxial source/drain regions 1300 may be in situ doped during their growth.

Corresponding to operation 216 of FIG. 2, FIG. 14 is a cross-sectional view of the FinFET device 300 including an interlayer dielectric (ILD) 1400 at one of the various stages of fabrication. The cross-sectional view of FIG. 14 is cut along the lengthwise direction of the active fin 404B (e.g., cross-section A-A indicated in FIG. 1).

In some embodiments, prior to forming the ILD 1400, a contact etch stop layer (CESL) 1402 is formed over the structure, as illustrated in FIG. 13. The CESL 1402 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1400 is formed over the CESL 1402 and over the dummy gate structures 1200. In some embodiments, the ILD 1400 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1400 is formed, an optional dielectric layer 1404 is formed over the ILD 1400. The dielectric layer 1404 can function as a protection layer to prevent or reduces the loss of the ILD 1400 in subsequent etching processes. The dielectric layer 1404 may be formed of a suitable material, such as silicon nitride, silicon carbonitride, or the like, using a suitable method such as CVD, PECVD, or FCVD. After the dielectric layer 1404 is formed, a planarization process, such as a CMP process, may be performed to achieve a level upper surface for the dielectric layer 1404. The CMP may also remove the mask 1106 and portions of the CESL 1402 disposed over the dummy gate 1104 (FIG. 12). After the planarization process, the upper surface of the dielectric layer 1404 is level with the upper surface of the dummy gate 1104, in some embodiments.

An example gate-last process (sometimes referred to as replacement gate process) can then performed to replace the dummy gate structure 1100 with an active gate structure (which may also be referred to as a replacement gate structure or a metal gate structure). Prior to replacing the dummy gate structure, a portion of the dummy gate structure disposed between the active fins can be replaced with an isolation structure so as to separate the active gate structure into different portions that are electrically coupled to the active fins, respectively. FIGS. 15A-18 illustrate the cross-sectional views of further processing (or making) of the FinFET device 300, which will be discussed in more detail as follows.

Figure 15A:
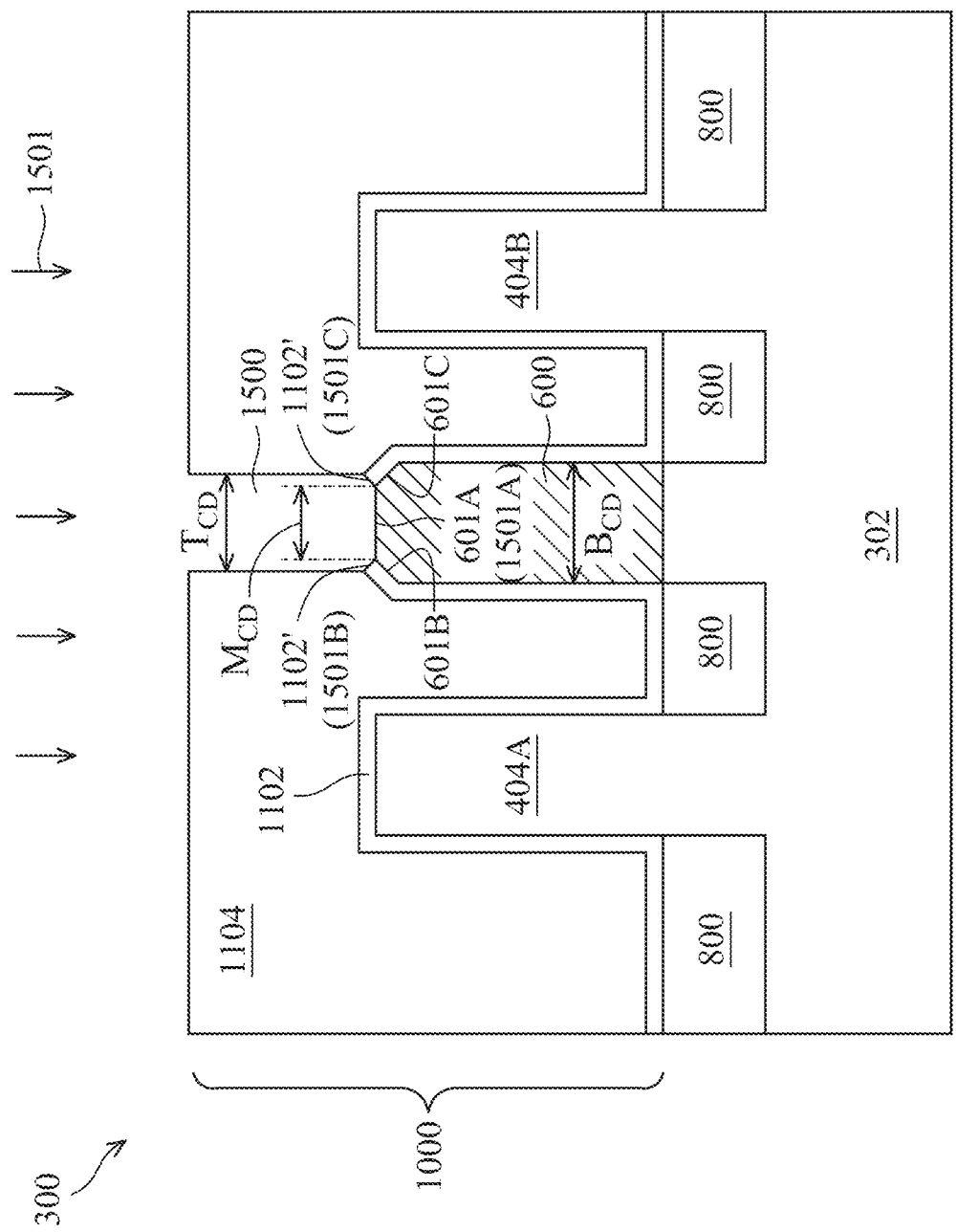
Figure 15B:
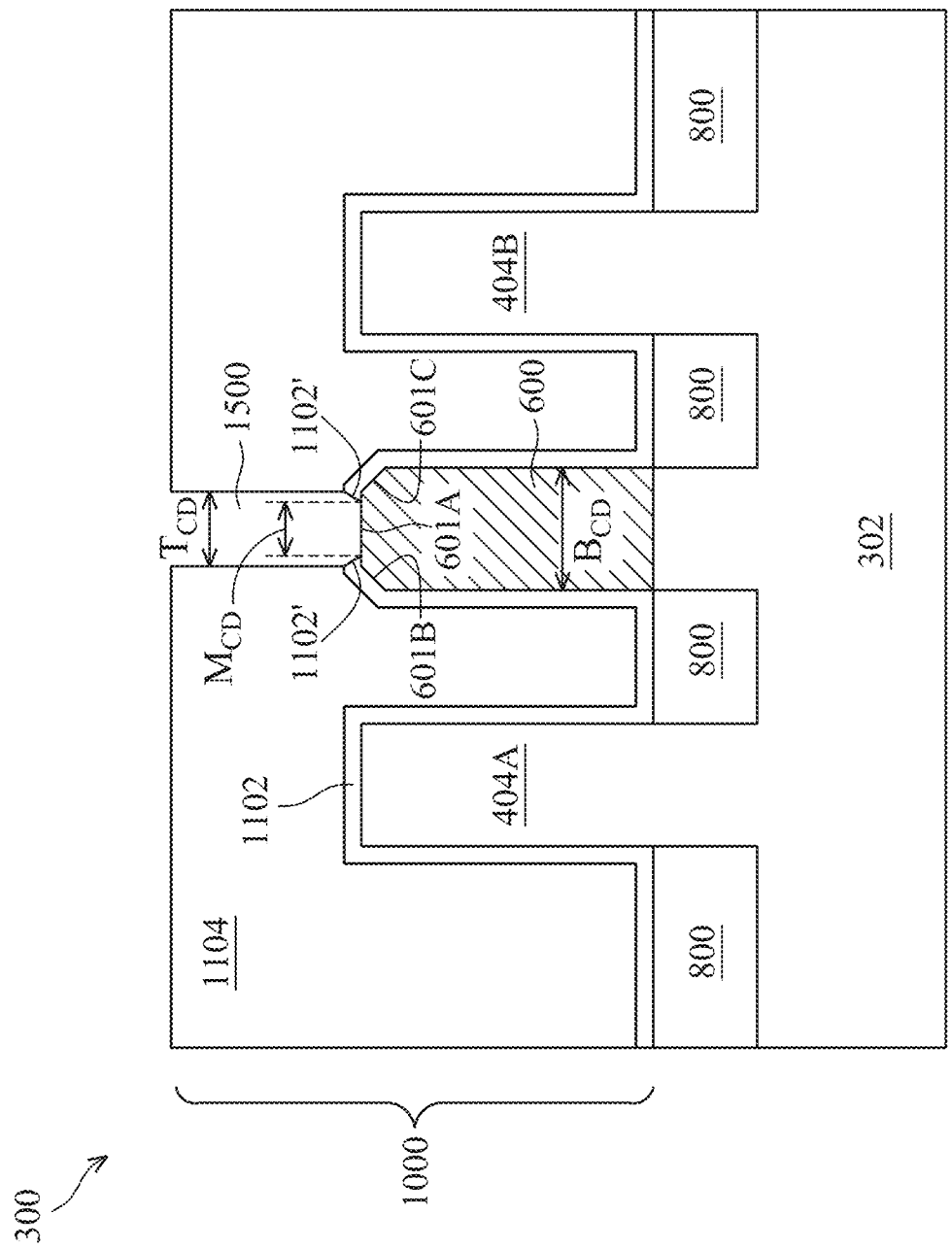
Figure 15C:
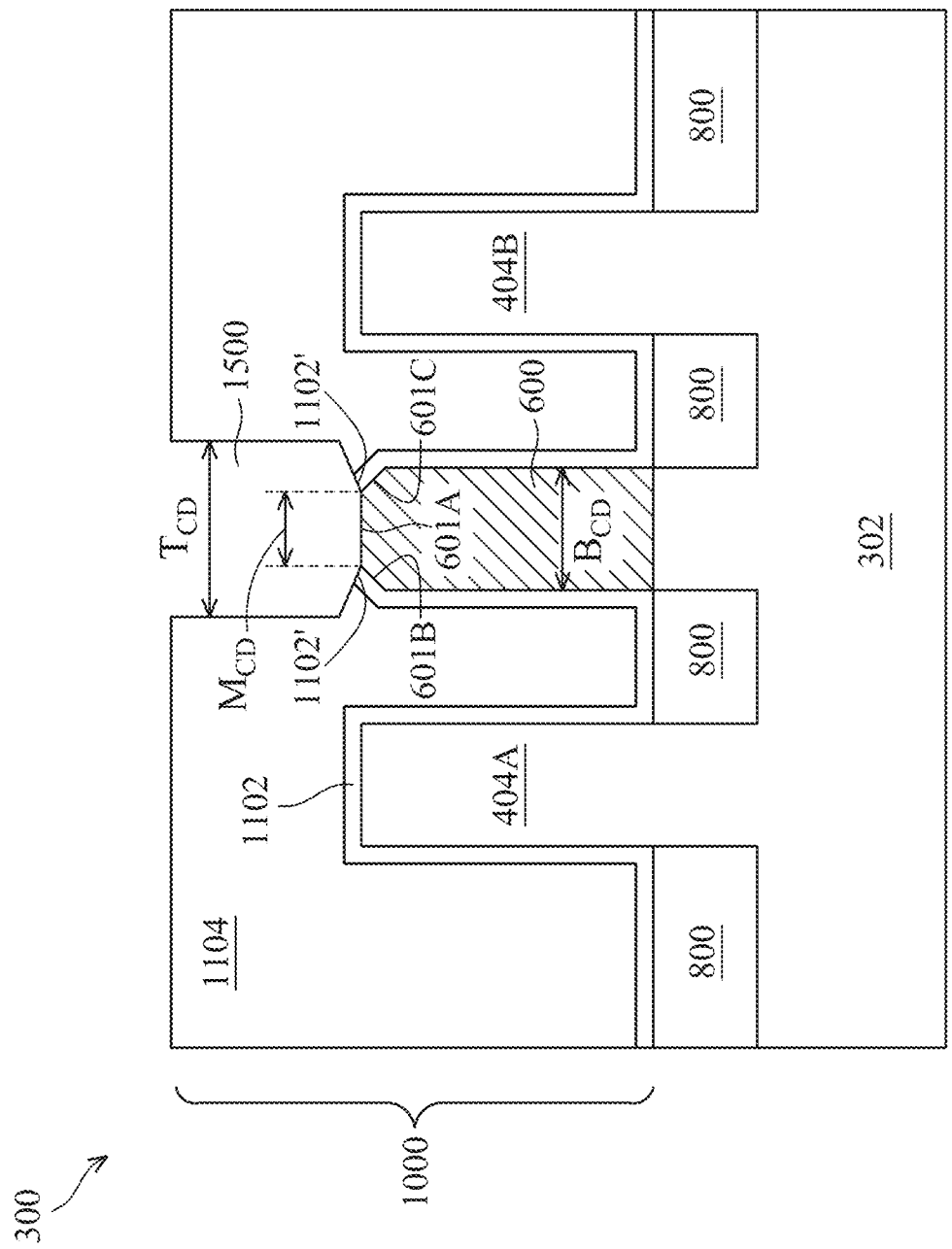

Corresponding to operation 218 of FIG. 2, FIGS. 15A, 15B, and 15C are each a cross-sectional view of the FinFET device 300 in which the dummy gate structure 1100 is cut, intercepted, or otherwise disconnected to form a gate cut trench (cavity or otherwise opening) 1500 at one of the various stages of fabrication. The cross-sectional views of FIGS. 15A-C are each cut along the lengthwise direction of an active/dummy gate structure of the FinFET device 300 (e.g., cross-section B-B indicated in FIG. 1).

Specifically, FIGS. 15A-C illustrate various embodiments of the gate cut trench 1500 that have respective different critical dimensions (CD's) along the lengthwise direction of the dummy gate structure 1100 (hereinafter "$T_{CD}$") with respect to a critical dimension of the dummy fin 600 along the same direction (hereinafter "$B_{CD}$"). In some embodiments, $T_{CD}$ corresponds to the maximum distance between respective sidewalls of the gate cut trench 1500; and $B_{CD}$ corresponds to the maximum distance between respective sidewalls of the dummy fin 600.

To form the gate cut trench 1500, a mask (not shown) may be formed over the dummy gate structure 1100 to expose a portion of the dummy gate structure 1100 desired to be removed (e.g., the portion disposed over the dummy fin 600), followed by an etching process 1501 (FIG. 15A) to remove the portion of the dummy gate structure 1100. In some embodiments, the removed portions of the dummy gate structure 1100 include a portion of the dummy gate 1104 and a portion of the dummy gate dielectric 1102 disposed above the dummy fin 600. For example, the etching process 1501 may be configured to remove the portion of the dummy gate 1104 so as to at least partially expose a top surface of the dummy gate dielectric 1102. Upon being exposed, the etching process 1501 may be continued to break through the portion of the dummy gate dielectric 1102 that has been exposed. In some embodiments, the etching process 1501 may be configured to have at least some anisotropic etching characteristic to limit lateral etch. As such, the gate cut trench 1500 may be gradually tapered from a wider $T_{CD}$ to a narrower $M_{CD}$. $M_{CD}$ corresponds to a critical dimension of a portion of the top surface of the dummy fin 600 (e.g., facet 601A) that is exposed by the gate cut trench 1500, as illustrated in FIGS. 15A-C.

Using such an etching process 1501 that includes some anisotropic etching characteristic, other facets of the top surface of the dummy fin 600 (e.g., facets 601B, 601C) may remain almost overlaid by the dummy gate dielectric 1102. In turn, portions of the dummy gate dielectric, 1102', can be exposed by the gate cut trench 1500. Such an exposed surface 1102' may be tilted away from the facet 601A toward a direction opposite to the direction toward which the facets 601B-C are tilted away from the facet 601A. Accordingly, the exposed surface 1102' and at least one of the facets 601A-C can form the sides of an angle, which can be less than, equal to, or greater than 90 degrees. In some embodiments, the exposed surfaces 1102' and the exposed portion of the facet 601A may constitute at least a portion of a bottom surface of the gate cut trench 1500. In other words, the bottom surface of the gate cut trench can include three portions: the exposed portion of the facet 601A and the exposed surfaces 1102' (and their respective extensions, e.g., FIG. 15C), which can sometimes be referred to as bottom surface portion 1501A, 1501B, and 1501C, respectively.

In the illustrated embodiment of FIG. 15A, Tcp is about equal to $B_{CD}$, and each of Tcp and $B_{CD}$ is greater than $M_{CD}$.

As such, the bottom surface of the gate cut trench 1500 can be constituted by a relatively large portion of the facet 601A (1501A), which can be characterized with $M_{CD}$, and the two surfaces 1102' (1501B-C), as shown in FIG. 15A. In some cases, Ten may be formed intentionally or inadvertently less than $B_{CD}$, as illustrated in FIG. 15B. When this occurs, $B_{CD}$ is greater than $T_{CD}$, and Ten is greater than $M_{CD}$. As such, the bottom surface of the gate cut trench 1500 can be constituted by a relatively small portion of the facet 601A (1501A), which can be characterized with $M_{CD}$, and the two surfaces 1102' (1501B-C). In some cases, Ten may be formed intentionally or inadvertently greater than $B_{CD}$, as illustrated in FIG. 15C. When this occurs, $T_{CD}$ is greater than $B_{CD}$, and Ben is greater than $M_{CD}$. As such, the bottom surface of the gate cut trench 1500 can be constituted by a relatively large portion of the facet 601A (1501A), which can be characterized with $M_{CD}$, and the two surfaces 1102' (1501B-C) with their respective extensions. Thus, regardless of $B_{CD}$ being equal to, greater than, or less than $T_{CD}$, Men is less than at least one of $B_{CD}$ or $T_{CD}$.

Further, regardless of $B_{CD}$ being equal to, greater than, or less than $T_{CD}$, each of the side portions (e.g., 1501B, 1501C) of the bottom surface of the gate cut trench 1500 and one of the facets of the top surface 601 can form a beak profile. For example, in FIG. 15A, the surface 1102' and either one of the facets 601B and 601C form a beak profile; in FIG. 15B, the surface 1102' and the facet 601A form a beak profile; and in FIG. 15C, the surface 1102' (and its extension) and either one of the facets 601B and 601C form a beak profile.

The etching process 1501 can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process 1501. However, it is noted that source powers, bias powers, pressures, and flow rates outside of these ranges are also contemplated.

In another example, the etching process 1501 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching rates.

Figure 16A:
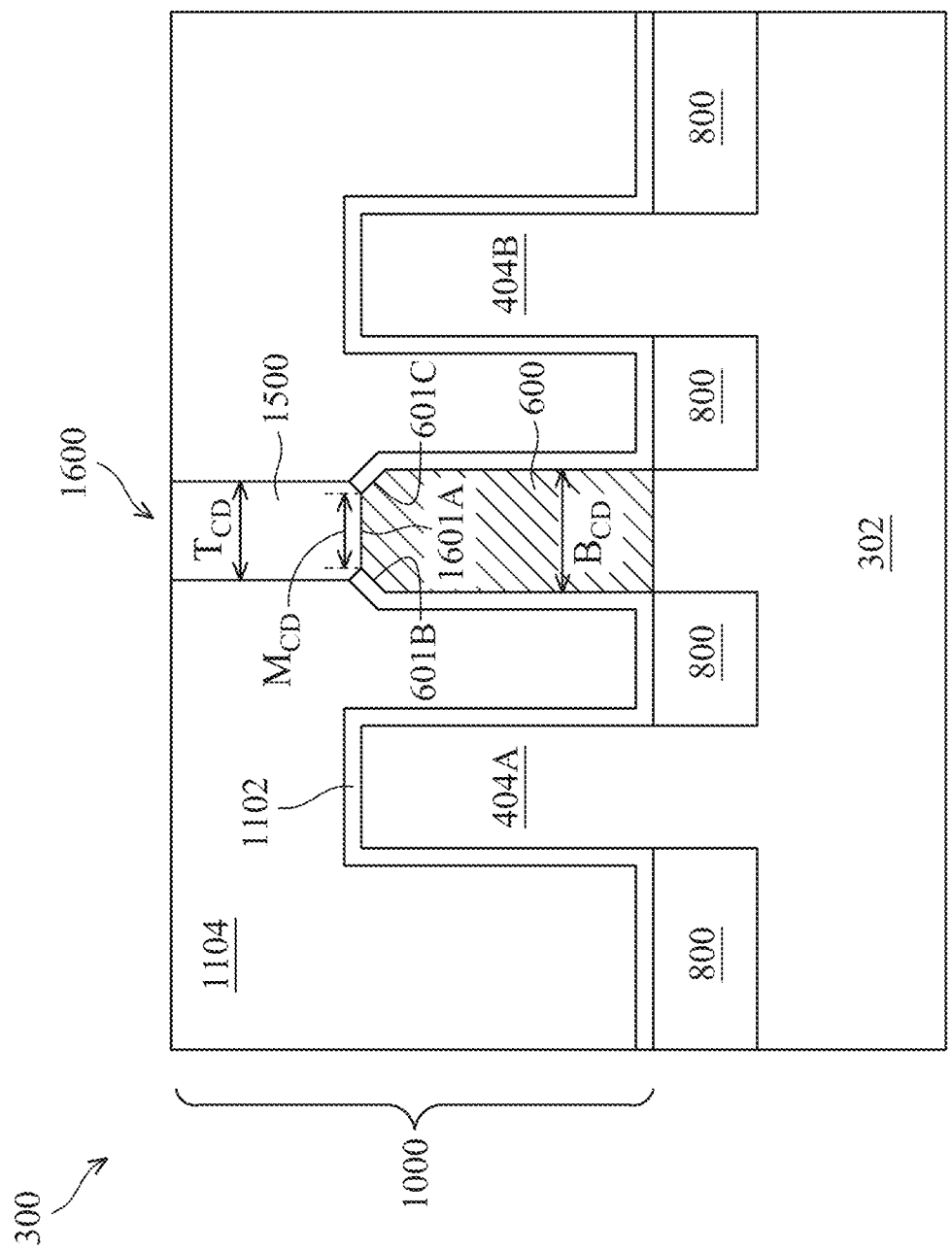
Figure 16B:
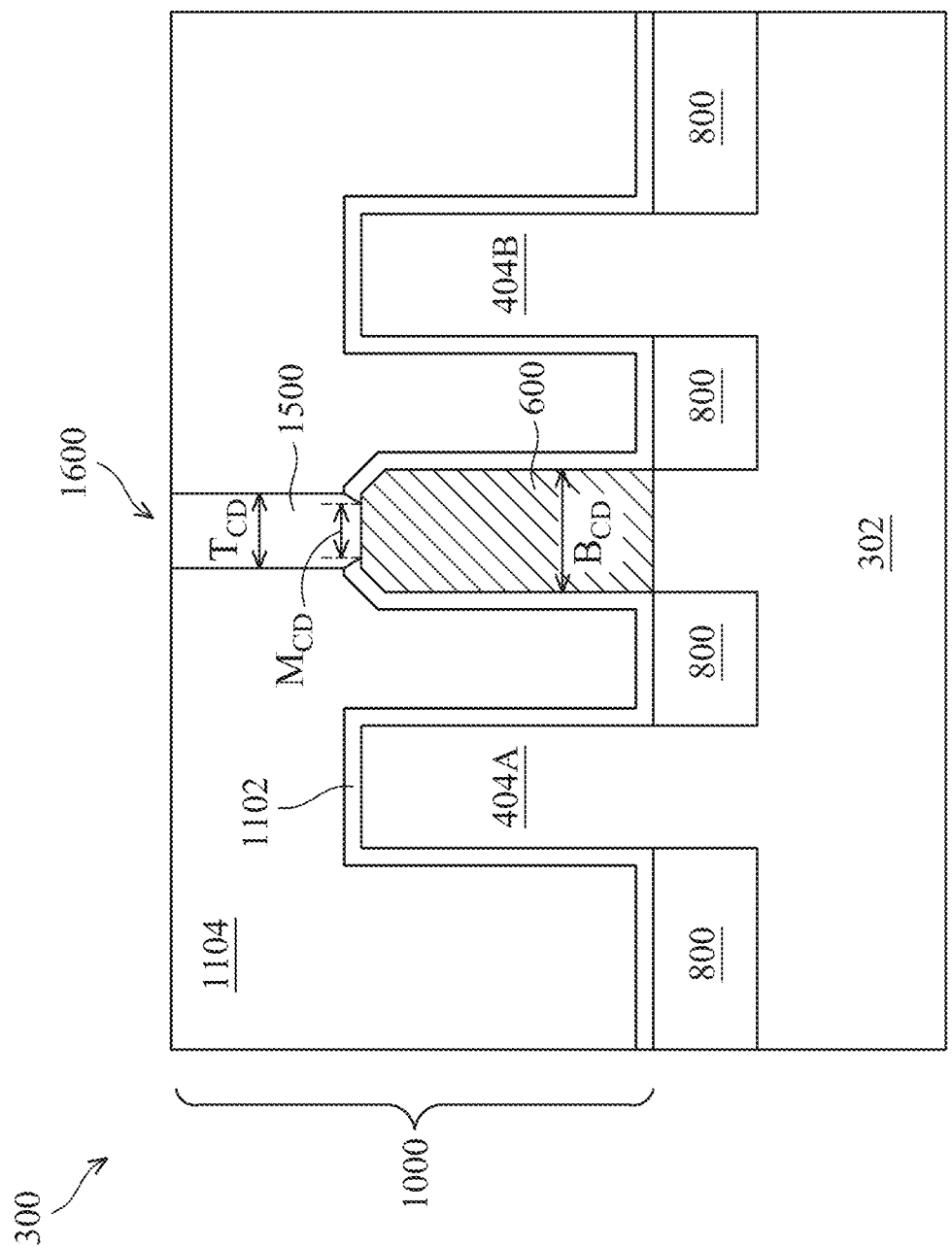
Figure 16C:
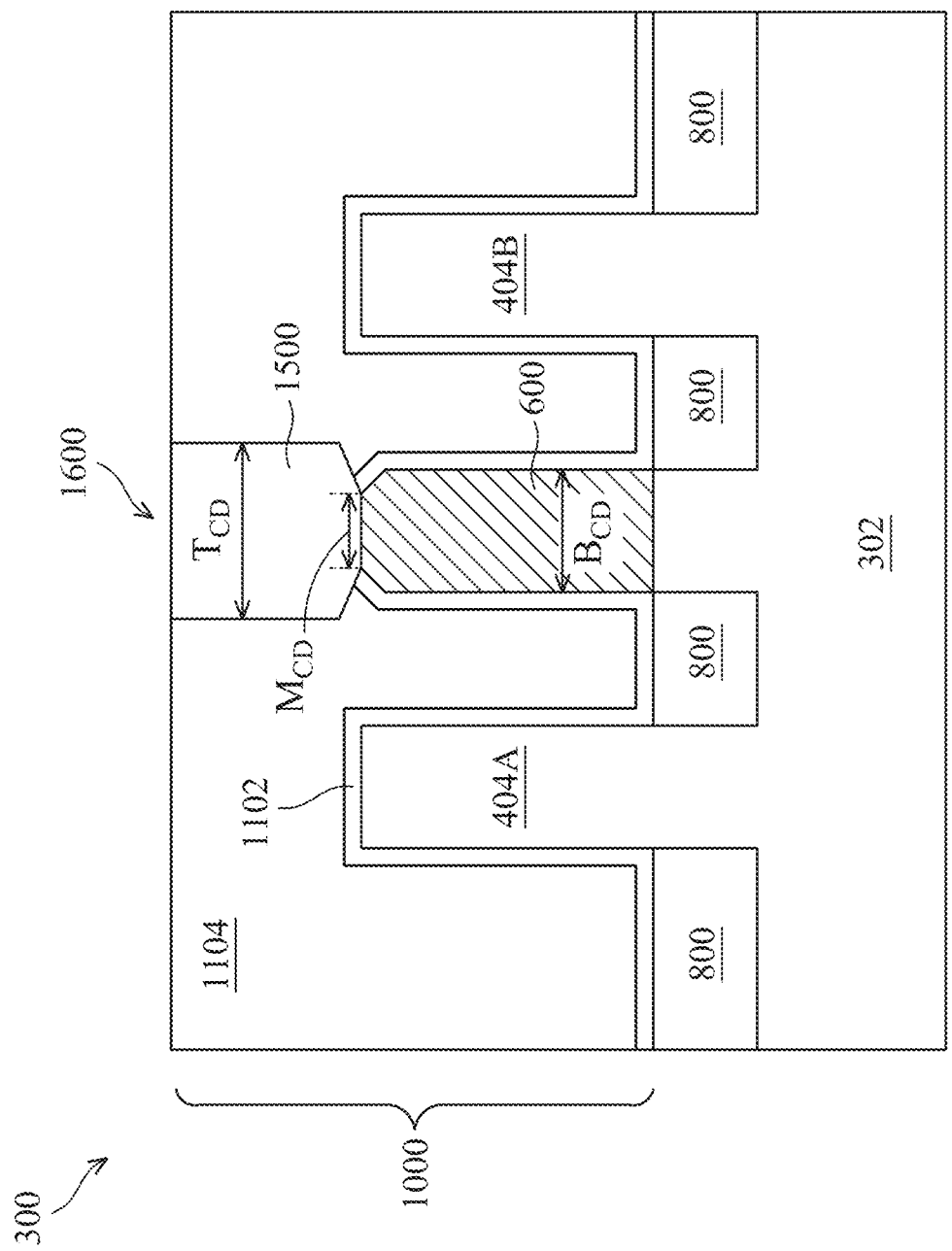

Corresponding to operation 220 of FIG. 2, FIGS. 16A, 16B, and 16C are each a cross-sectional view of the FinFET device 300 including a gate isolation structure 1600 at one of the various stages of fabrication. The cross-sectional views of FIGS. 16A-C are each cut along the lengthwise direction of the dummy gate structure 1100 (e.g., cross-section B-B indicated in FIG. 1). Specifically, the gate isolation structures 1600 of FIGS. 16A-C are formed according to the gate cut trenches 1500 of FIGS. 15A-C, respectively.

The gate isolation structure 1600 is formed by filling the gate cut trench 1500 with a dielectric material, which can thus inherit the profile (or dimensions) of the gate cut trench 1500. As such, the gate isolation structure 1600 can have a bottom surface including three portions 1601A, 1601B, and 1601C that follow the profiles of the portions 1501A, 1501B, 1501C (as illustrated in FIG. 15A), respectively. Further, the gate isolation structure 1600 can include upper sidewalls separated by a greater distance and lower sidewalls separated by a lesser distance, where the greater distance and lesser distance can be characterized with $T_{CD}$ and $M_{CD}$, respectively. For example in FIG. 16A where the gate isolation structure 1600 fills the gate cut trench 1500 of FIG. 15A, the gate isolation structure 1600 can have its $T_{CD}$ about equal to $B_{CD}$ and its $M_{CD}$ less than either $T_{CD}$ or $B_{CD}$. For example in FIG. 16B where the gate isolation structure 1600 fills the gate cut trench 1500 of FIG. 15B, the gate isolation structure 1600 can have its $T_{CD}$ less than $B_{CD}$ and its $M_{CD}$ less than either $T_{CD}$ or $B_{CD}$. For example in FIG. 15C where the gate isolation structure 1600 fills the gate cut trench 1500 of FIG. 15C, the gate isolation structure 1600 can have its $T_{CD}$ greater than $B_{CD}$ and its $M_{CD}$ less than either $T_{CD}$ or $B_{CD}$.

The dielectric material that is used to form the gate isolation structure 1600 may include, for example, silicon oxide, silicon nitride, silicon oxynitride, silicon carbide, silicon carbonitride, silicon oxycarbonitride, silicon oxycarbide, or combinations thereof. The gate isolation structure 1600 can be formed by depositing the dielectric material in the gate cut trench 1500 using any suitable method, such as CVD, PECVD, or FCVD. After the deposition, a CMP may be performed to remove any excess dielectric material from the remaining dummy gate structure 1100.

Although the examples of FIGS. 16A-C show that the gate isolation structure 1600 fills the gate cut trench 1500 with a single dielectric piece (which can include one or more dielectric materials listed above), it is understood that the gate isolation structure 1600 can include multiple pieces. Each of the pieces may include, for example, silicon oxide, silicon nitride, silicon oxynitride, silicon carbide, silicon carbonitride, silicon oxycarbonitride, silicon oxycarbide, or combinations thereof. For example, the gate isolation structure 1600 may include a first piece, which is formed as a conformal layer lining the gate cut trench 1500, and a second piece, which fills the gate cut trench 1500 with the first piece coupled therebetween. In another example, the gate isolation structure 1600 may include a first piece, which fills a lower portion of the gate cut trench 1500, and a second piece, which fills an upper portion of the gate cut trench 1500.

Figure 17:
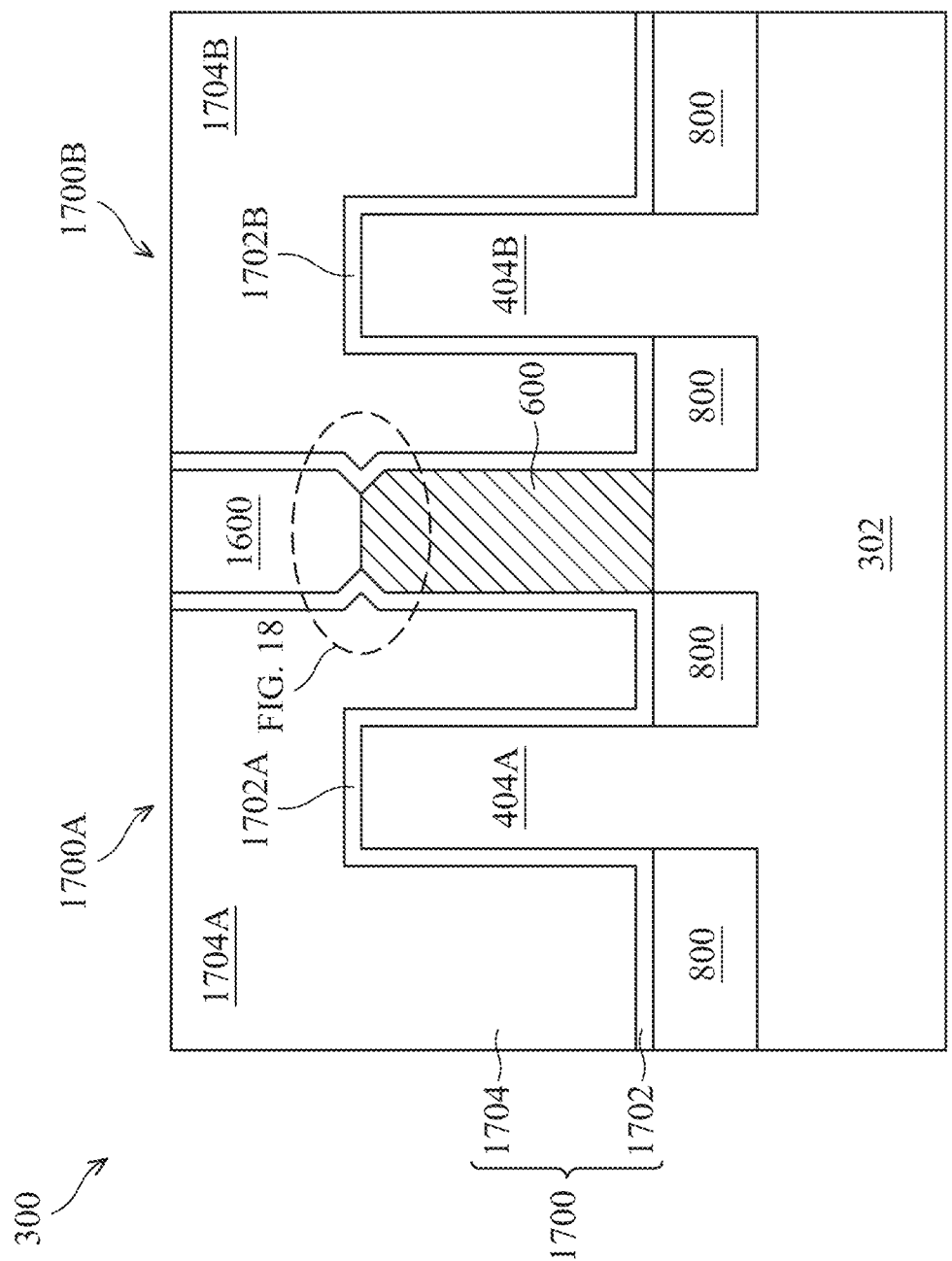
Figure 18:
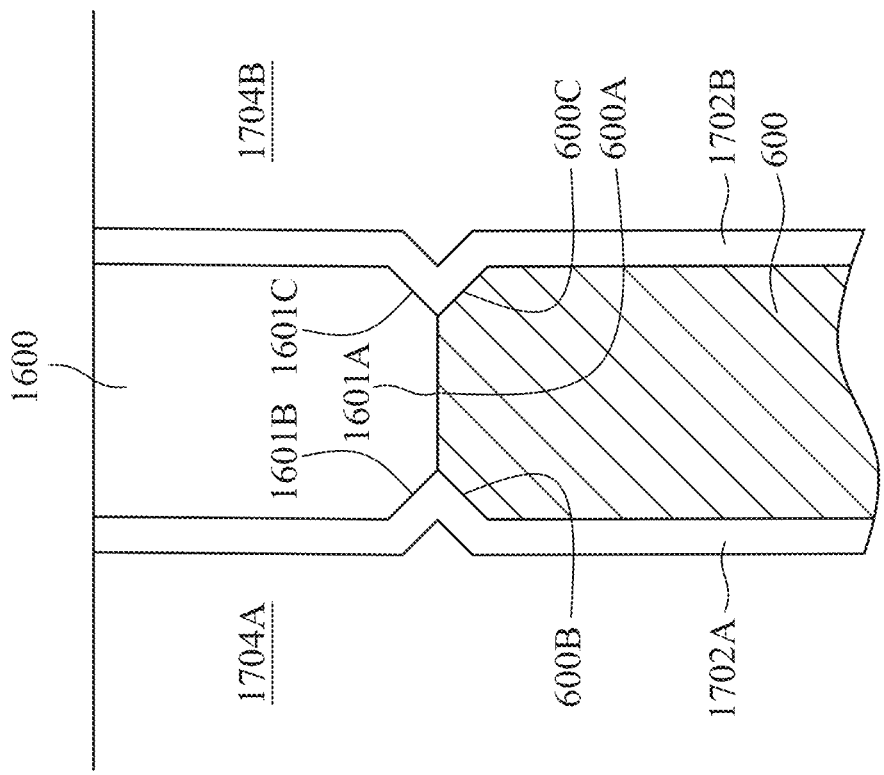

Corresponding to operation 222 of FIG. 2, FIG. 17 is a cross-sectional view of the FinFET device 300 including an active gate structure 1700 at one of the various stages of fabrication. FIG. 18 is an enlarged view of the cross-sectional view of the active gate structure 1700 around the dummy fin 600 and gate isolation structure 1600. The cross-sectional view of FIGS. 17-18 are each cut along a lengthwise direction of the active gate structure 1700 (e.g., cross-section B-B indicated in FIG. 1).

The active gate structure 1700 may be formed by replacing the dummy gate structure 1100. As illustrated, the active gate structure 1700 may include two portions 1700A and 1700B that are separated by the gate isolation structure 1600 and the dummy fin 600. The portion 1700A can overlay the active fin 404A, and the portion 1700B can overlay the active fin 404B. After the active gate structure 1700 is formed, the FinFET device 300 can include a number of transistors. For example, a first active transistor, adopting the active fin 404A as its conduction channel and portion 1700A as its active gate structure, may be formed; and a second active transistor, adopting the active fin 404B as its conduction channel and portion 1700B as its active gate structure, may be formed.

The active gate structure 1700 can include a gate dielectric layer 1702, a metal gate layer 1704, and one or more other layers that are not shown for clarity. For example, the active gate structure 1700 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer 1702 is formed in a corresponding gate trench to surround (e.g., straddle) one or more fins. In an embodiment, the gate dielectric layer 1702 can be a remaining portion of the dummy gate dielectric 1102. In another embodiment, the gate dielectric layer 1702 can be formed by removing the dummy gate dielectric 1102, followed by conformal deposition or thermal reaction. In yet another embodiment, the gate dielectric layer 1702 can be formed by removing the dummy gate dielectric 1102, followed by no further processing step (i.e., the gate dielectric layer 1702 may be a native oxide over the active fins 404A-B). The following discussions are directed to the gate dielectric layer 1702 that is formed by removing the dummy gate dielectric 1102 and performing conformal deposition. For example, the gate dielectric layer 1702 of the portion 1700A (sometimes referred to as "gate dielectric layer 1702A") is deposited in a gate trench that is formed by removing a portion of the dummy gate structure 1000 (e.g., the remaining dummy gate dielectric 1102 and dummy gate 1104) on the left-hand side of the dummy fin 600. The gate dielectric layer 1702A can overlay the top surfaces and the sidewalls of the active fin 404A, one of the sidewalls of the dummy fin 600, and one of the sidewalls of the gate isolation structure 1600, as shown in FIG. 17. The gate dielectric layer 1702 of the portion 1700B (sometimes referred to as "gate dielectric layer 1702B") is deposited in a gate trench that is formed by removing a portion of the dummy gate structure 1100 (e.g., the remaining dummy gate dielectric 1102 and dummy gate 1104) on the right-hand side of the dummy fin 600. The gate dielectric layer 1702B can overlay the top surfaces and the sidewalls of the active fin 404B, the other of the sidewalls of the dummy fin 600, and the other of the sidewalls of the gate isolation structure 1600, as shown in FIG. 17.

The gate dielectric layer 1702 includes silicon oxide, silicon nitride, or multilayers thereof. In example embodiments, the gate dielectric layer 1702 includes a high-k dielectric material, and in these embodiments, the gate dielectric layer 1702 may have a k value greater than about 7.0, and may include a metal oxide or a silicate of Hf, Al, Zr, La, Mg, Ba, Ti, Pb, or combinations thereof. The formation methods of gate dielectric layer 1702 may include molecular beam deposition (MBD), atomic layer deposition (ALD), PECVD, and the like. A thickness of the gate dielectric layer 1702 may be between about 8 angstroms (Å) and about 20 Å, as an example.

The metal gate layer 1704 is formed over the gate dielectric layer 1702. The metal gate layer 1704 of the portion 1700A (sometimes referred to as "metal gate layer 1704A") is deposited in the gate trench over the gate dielectric layer 1702A; and the metal gate layer 1704 of the portion 1700B (sometimes referred to as "metal gate layer 1704B") is deposited in the gate trench over the gate dielectric layer 1702B. The metal gate layer 1704 may be a P-type work function layer, an N-type work function layer, multi-layers thereof, or combinations thereof, in some embodiments. Accordingly, the metal gate layer 1704 is sometimes referred to as a work function layer. For example, the metal gate layer 1704 may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

In accordance with various embodiments, the portions of the active gate structure separated by the dummy fin 600 and the gate isolation structure 1600, 1700A and 1700B, can inherit the beak profile formed by the surfaces/facets of the dummy fin 600 and the gate isolation structure 1600. As better present in the enlarged view of FIG. 18, at least one of the gate dielectric layer 1702A or the metal gate layer 1704A can have their respective surfaces extending along the bottom surface portion 1601B and the facet 600B, which causes at least one of the gate dielectric layer 1702A or the metal gate layer 1704A to present a first beak profile around the interface of the dummy fin 600 and the gate isolation structure 1600. Similarly, at least one of the gate dielectric layer 1702B or the metal gate layer 1704B can have their respective surfaces extending along the bottom surface portion 1601C and the facet 600C, which causes at least one of the gate dielectric layer 1702B or the metal gate layer 1704B to present a second beak profile around the interface of the dummy fin 600 and the gate isolation structure 1600. The first beak profile and the second beak profile can point toward each other. Specifically, those surfaces forming the beak profile (e.g., the surfaces extending along 1601B and 600B, the surfaces extending along 1601C and 600C) may merge with each other on an edge, which is laterally aligned with the interface of the dummy fin 600 and the gate isolation structure 1600 (e.g., the interface between the bottom surface portion 1601A and the facet 600A).

In one aspect of the present disclosure, a semiconductor device is disclosed. The semiconductor device includes a first semiconductor fin and a second semiconductor fin extending along a first direction. The semiconductor device includes a dielectric fin that extends along the first direction and is disposed between the first and second semiconductor fins. The semiconductor device includes a gate isolation structure vertically disposed above the dielectric fin. The semiconductor device includes a gate structure extending along a second direction perpendicular to the first direction. The gate structure includes a first portion straddling the first semiconductor fin and a second portion straddling the second semiconductor fin. The gate isolation structure has a bottom surface including a first portion, a second portion, and a third portion, and the dielectric fin has a top surface including a first portion, a second portion, and a third portion. The second portion of the bottom surface is in contact with the second portion of the top surface, with the respective first portions and the respective third portions tilted away from the second portions toward opposite directions.

In another aspect of the present disclosure, a semiconductor device is disclosed. The semiconductor device includes a substrate. The semiconductor device includes a dielectric fin that is formed over the substrate and extends along a first direction. The semiconductor device includes a gate isolation structure vertically disposed above the dielectric fin. The semiconductor device includes a gate structure extending along a second direction perpendicular to the first direction. The gate structure includes a first portion and a second portion separated by the gate isolation structure and the dielectric fin. The first portion of the gate structure presents a first beak profile and the second portion of the gate structure presents a second beak profile. The first and second beak profiles point toward each other.

In yet another aspect of the present disclosure, a method for fabricating a semiconductor device is disclosed. The method includes forming a first semiconductor fin and a second semiconductor fin extending along a first direction on a substrate. The method includes forming a dielectric fin disposed between the first and second semiconductor fins. The dielectric fin extends along the first direction. The method includes forming a gate isolation structure over the dielectric fin. The gate isolation structure has a portion of its bottom surface coupled to a portion of a top surface of the dielectric fin. The method includes forming a gate structure extending along a second direction perpendicular to the first direction. The gate structure includes a first portion and a second portion separated by the gate isolation structure and the dielectric fin such that the first portion has a first beak profile and the second portion has a second beak profile. The first and second beak profiles point toward each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming a semiconductor fin protruding from on a substrate;
   forming a dielectric fin protruding from the substrate, wherein a top surface of the dielectric fin includes a first facet and a second facet;
   forming a dummy gate structure over the semiconductor fin and the dielectric fin;
   forming a gate isolation structure in the dummy gate structure, the gate isolation structure landing on the top surface of the dielectric fin along an interface, wherein:
   a bottom surface of the gate isolation structure includes a third facet and a fourth facet;
   the third facet and the first facet point towards one another; and
   the fourth facet and the second facet point towards one another; and
   forming a gate structure in place of the dummy gate structure, such that the gate isolation structure separates the gate structure.

2. The method of claim 1, wherein the gate isolation structure is formed to a first width and the dielectric fin is formed to a second width that is less than the first width.

3. The method of claim 1, wherein the gate isolation structure is formed a first width and the dielectric fin is formed a second width that is greater than the first width.

4. The method of claim 1, wherein forming the gate structure includes:
   removing the dummy gate structure to form a gate trench surrounding the gate isolation structure;
   depositing a gate dielectric layer over the semiconductor fin, the dielectric fin, and the gate isolation structure; and
   depositing a metal gate layer over the gate dielectric layer.

5. The method of claim 1, further comprising forming isolation regions over the substrate, wherein the isolation regions surround bottom portions of the semiconductor fin.

6. The method of claim 5, wherein a bottom portion of the dielectric fin is disposed over a top surface of the isolation regions.

7. The method of claim 5, wherein a bottom portion of the dielectric fin extends to below a top surface of the isolation regions.

8. The method of claim 7, wherein the first facet and the second facet each extend from the top surface of the gate isolation structure to the top surface of the isolation regions.

9. A method of fabricating a semiconductor device, comprising:
   forming a semiconductor fin protruding from on a substrate;
   forming a dielectric fin protruding from the substrate and adjacent to the semiconductor fin, wherein a top surface of the dielectric fin includes a first facet and a second facet;
   forming a dummy gate structure engaging the semiconductor fin and the dielectric fin;
   forming a trench in the dummy gate structure, wherein a bottom surface of the trench includes a third facet and a fourth facet, the third facet meeting the first facet at a first point and the fourth facet meeting the second facet at a second point;

forming a gate isolation structure in the trench, wherein the gate isolation structure directly contacts the dielectric fin at an interface that extends between the first point and the second point; and replacing the dummy gate structure with a gate structure, the gate isolation structure interposed between portions of the gate structure.

10. The method of claim 9, wherein forming the dummy gate structure includes:

forming a dummy gate dielectric over the semiconductor fin and the dielectric fin; and forming a dummy gate over the dummy gate dielectric.

11. The method of claim 10, wherein forming the trench includes performing an etching process to remove a portion of the dummy gate dielectric that extends between the first facet and the second facet, thereby exposing a portion of the top surface of the dielectric fin in the trench.

12. The method of claim 9, wherein the gate isolation structure is formed to a first width and the dielectric fin is formed to a second width that is less than the first width.

13. The method of claim 9, wherein the gate isolation structure is formed a first width and the dielectric fin is formed a second width that is greater than the first width.

14. The method of claim 9, wherein replacing the dummy gate structure includes:

removing the dummy gate structure to form a gate trench surrounding the gate isolation structure;

depositing a gate dielectric layer over the semiconductor fin, the dielectric fin, and the gate isolation structure, such that the gate dielectric layer traverses the first point and the second point; and depositing a metal gate layer over the gate dielectric layer.

15. The method of claim 9, further comprising forming isolation regions over the substrate, wherein the isolation regions surround bottom portions of the semiconductor fin, and wherein a bottom portion of the dielectric fin extends to below a top surface of the isolation regions.

16. A method of fabricating a semiconductor device, comprising:

forming a semiconductor fin protruding from on a substrate;

forming a dielectric fin protruding from the substrate and adjacent to the semiconductor fin, wherein a top surface of the dielectric fin includes a first facet and a second facet;

forming a dummy gate structure over the semiconductor fin and the dielectric fin;

forming a gate isolation structure, including:

forming a trench in the dummy gate structure, wherein a bottom surface of the trench includes a third facet and a fourth facet, the third facet and the first facet forming a first angle and the fourth facet and the second facet forming a second angle, the first angle and the second angle pointing towards one another; and forming the gate isolation structure in the trench; and replacing the dummy gate structure with a gate structure, the gate structure surrounding the gate isolation structure.

17. The method of claim 16, wherein the gate isolation structure is formed to a first width and the dielectric fin is formed to a second width that is the same as the first width.

18. The method of claim 16, wherein the gate isolation structure is formed to a first width and the dielectric fin is formed to a second width that is different from the first width.

19. The method of claim 16, wherein forming the dummy gate structure includes:

forming a dummy gate dielectric over the semiconductor fin and the dielectric fin, wherein the dummy gate dielectric is formed over the first facet and the second facet; and forming a dummy gate over the dummy gate dielectric.

20. The method of claim 19, wherein forming the trench includes performing an etching process to remove a portion of the dummy gate dielectric formed over the top surface of the dielectric fin between the first facet and the second facet, such that the gate isolation structure is formed to directly contact the top surface of the dielectric fin.

* * * * *